(12) United States Patent
Balandin et al.

(10) Patent No.: US 12,137,546 B2
(45) Date of Patent: Nov. 5, 2024

(54) ELECTROMAGNETIC AND THERMAL SHIELDS WITH LOW-DIMENSIONAL MATERIALS

(71) Applicant: THE REGENTS OF THE UNIVERSITY OF CALIFORNIA, Oakland, CA (US)

(72) Inventors: Alexander A. Balandin, Riverside, CA (US); Fariborz Kargar, Riverside, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 301 days.

(21) Appl. No.: 17/455,280

(22) Filed: Nov. 17, 2021

(65) Prior Publication Data

US 2022/0264775 A1 Aug. 18, 2022

Related U.S. Application Data

(60) Provisional application No. 63/114,883, filed on Nov. 17, 2020.

(51) Int. Cl.
| | |
|---|---|
| B32B 27/18 | (2006.01) |
| B32B 27/38 | (2006.01) |
| C08G 59/30 | (2006.01) |
| C08K 3/04 | (2006.01) |
| C08K 7/04 | (2006.01) |
| H05K 9/00 | (2006.01) |

(52) U.S. Cl.
CPC .............. *H05K 9/009* (2013.01); *B32B 27/18* (2013.01); *B32B 27/38* (2013.01); *C08G 59/308* (2013.01); *C08K 3/042* (2017.05); *C08K 7/04* (2013.01); *H05K 9/0088* (2013.01); *B32B 2262/10* (2013.01); *B32B 2307/212* (2013.01); *C08K 2201/003* (2013.01); *C08K 2201/004* (2013.01); *C08K 2201/011* (2013.01)

(58) Field of Classification Search
CPC .... H05K 9/009; H05K 9/0088; H05K 9/0083; B32B 27/18; B32B 27/38; B32B 2262/10; B32B 2307/212; C08G 59/308; C08K 3/042; C08K 7/04; C08K 3/30; C08K 2201/003; C08K 2201/004; C08K 2201/011
USPC ........................................................ 428/300.7
See application file for complete search history.

(56) References Cited

U.S. PATENT DOCUMENTS

| | | | |
|---|---|---|---|
| 2017/0217775 A1* | 8/2017 | Sohn ...................... | C01B 32/192 |
| 2020/0385534 A1* | 12/2020 | Zdrojek ................ | C08K 3/042 |

OTHER PUBLICATIONS

Kikkawa, et al., "High-Pressure Syntheses of TaS3, NbS3, TaSe3, and NbSe3 with NbSe3-type Crystal Structure", Journal of Solid State Chemistry, vol. 41, Issue 3, 1982, pp. 315-322.

(Continued)

*Primary Examiner* — Matthew D Matzek
(74) *Attorney, Agent, or Firm* — Buchanan Ingersoll & Rooney PC

(57) ABSTRACT

An electromagnetic interface (EMI) shielding material and method for producing the electromagnetic interface (EMI) shielding material. The EMI shielding material including a polymer matrix and a van der Waals material embedded in the polymer matrix and forming quasi-one-dimensional atomic threads, and wherein the van der Waals material is a trichalcogenide compound.

19 Claims, 19 Drawing Sheets

(56) References Cited

OTHER PUBLICATIONS

Kikkawa, et al., "The Selenide Systems of Niobium and Tantalum", Journal of Solid State Chemistry, vol. 41, Issue 3, 1982, pp. 323-328.
Kim, et al., "Thickness-Dependence Electrical Characterization of the One-Dimensional van der Waals TaSe3 Crystal", Materials, vol. 12, No. 15, Aug. 2, 2019, pp. 2462-1-2462-9.
Kostoff, et al., "Adverse Health Effects of 5G Mobile Networking Technology Under Real-Life Conditions", Toxicology Letters, vol. 323, 2020, pp. 35-40.
Kuester, et al., "Processing and Characterization of Conductive Composites Based on Poly(styrene-b-ethylene-ran- butylene-b-styrene) (SEBS) and Carbon Additives: A Comparative Study of Expanded Graphite and Carbon Black", Composites Part B: Engineering, vol. 84, 2016, pp. 236-247.
Kumagai, et al., "Cylinder Vortex of Superconductor in TaSe3 Topological Ring Crystals", Journal of Physics: Conference Series, vol. 150, 2009, pp. 052134-1-052134-4.
Kumar, et al., "Large-Area Reduced Graphene Oxide Thin Film with Excellent Thermal Conductivity and Electromagnetic Interference Shielding Effectiveness", Carbon, vol. 94, 2015, pp. 494-500.
Lee, et al., "Influence of Aspect Ratio and Skin Effect on EMI Shielding of Coating Materials Fabricated with Carbon Nanofiber/PVDF", Journal of Materials Science, vol. 37, No. 09, 2002, pp. 1839-1843.
Lee, et al., "Multilayered Graphene-Carbon Nanotube-Iron Oxide Three-Dimensional Heterostructure for Flexible Electromagnetic interference Shielding Film", Carbon, vol. 111, 2017, pp. 248-257.
Li, et al., "Highly Conducting Graphene Sheets and Langmuir-Blodgett Films", Nature Nanotechnology, vol. 3, No. 9, Aug. 1, 2008, pp. 538-542.
Li, et al., "High-Temperature Dielectric and Microwave Absorption Properties of Si3N4-SiC/SiO2 Composite Ceramics", Journal of Materials Science, vol. 50, No. 03, Nov. 19, 2014, pp. 1478-1487.
Li, et al., "The Influence of Gradient and Sandwich Configurations on the Electromagnetic Interference Shielding Performance of Multilayered Thermoplastic Polyurethane/Graphene Composite Foams", Composites Science and Technology, vol. 138, 2017, pp. 209-216.
Li, et al., "Thermal Frequency Shift and Tunable Microwave Absorption in BiFeO3 Family", Scientific Reports, vol. 6, No. 1, Apr. 20, 2016, pp. 1-6.
Li, et al., "Thermally Annealed Anisotropic Graphene Aerogels and Their Electrically Conductive Epoxy Composites with Excellent Electromagnetic Interference Shielding Efficiencies", ACS Applied Materials & Interfaces, vol. 08, No. 48, 2016, pp. 33230-33239.
Liang, et al., "Electromagnetic Interference Shielding of Graphene/Epoxy Composites", Carbon, vol. 47, Issue 3, 2009, pp. 922-925.
Liang, et al., "Lightweight and Flexible Graphene/SiC-Nanowires/Poly(Vinylidene Fluoride) Composites for Electromagnetic Interference Shielding and Thermal Management", Carbon, vol. 156, 2020, pp. 58-66.
Liang, et al., "Multifunctional Flexible Electromagnetic Interference Shielding Silver Nanowires/Cellulose Films with Excellent Thermal Management and Joule Heating Performances", ACS Appl. Mater. Interfaces, vol. 12, No. 15, Mar. 25, 2020, pp. 18023-18031.
Lin, et al., "Polymer Composites Made of Multi-Walled Carbon Nanotubes and Graphene Nano-Sheets: Effects of Sandwich Structures on their Electromagnetic Interference Shielding Effectiveness", Composites Part B: Engineering, vol. 89, 2016, pp. 424-431.
Ling, et al., "Facile Preparation of Lightweight Microcellular Polyetherimide/Graphene Composite Foams for Electromagnetic Interference Shielding", ACS Applied Materials & Interfaces, vol. 5, No. 7, Mar. 6, 2013, pp. 2677-2684.
Lipatov, et al., "Quasi-1D TiS3 Nanoribbons: Mechanical Exfoliation and Thickness-Dependent Raman Spectroscopy", ACS Nano, vol. 12, No. 12, Nov. 13, 2018, pp. 12713-12720.

Liu, et al., "Direct Fabrication of Functional Ultrathin Single-Crystal Nanowires from Quasi-One-Dimensional van der Waals Crystals", Nano Letters, vol. 16, No. 10, Aug. 31, 2016, pp. 6188-6195.
Liu, et al., "Electromagnetic Property and Tunable Microwave Absorption of 3D Nets from Nickel Chains at Elevated Temperature", ACS Applied Materials & Interfaces, vol. 8, No. 34, Aug. 10, 2016, pp. 22615-22622.
Liu, et al., "Low-Frequency Electronic Noise in Quasi-1D TaSe3 van der Waals Nanowires", Nano Letters, vol. 17, No. 1, Nov. 28, 2016, pp. 377-383.
Liu, et al., "Origin of 1/f Noise in Graphene Multilayers: Surface vs. Volume", Applied Physics Letters, vol. 102, No. 9, Mar. 6, 2013, pp. 093111-1-093111-5.
Luo, et al., "Graphene Shield by SiBCN Ceramic: A Promising High-Temperature Electromagnetic Wave-Absorbing Material with Oxidation Resistance", ACS Applied Materials & Interfaces, vol. 10, No. 45, Oct. 28, 2018, pp. 39307-39318.
Matula, R. A, "Electrical Resistivity of Copper, Gold, Palladium, and Silver", Journal of Physical and Chemical Reference Data 8, vol. 8, No. 4, Oct. 15, 2009, 153 pages.
Mazzoli, et al., "Effect of Graphene Oxide and Metallic Fibers on the Electromagnetic Shielding Effect of Engineered Cementitious Composites", Journal of Building Engineering, vol. 18,, 2018, pp. 33-39.
Merizgui, et al., "Effect of temperature on the Electromagnetic Characteristic Behavior of Copper", 2018 International Conference on Applied Smart Systems (ICASS'2018), Nov. 24-25, 2018, 5 pages.
Min, et al., "Scale-Up Production of Lightweight High-Strength Polystyrene/Carbonaceous Filler Composite Foams with High-Performance Electromagnetic Interference Shielding", Materials Letters, vol. 230, 2018, pp. 157-160.
Mondal, et al., "Low Percolation Threshold and Electromagnetic Shielding Effectiveness of Nano-Structured Carbon based Ethylene Methyl Acrylate Nanocomposites", Composites Part B: Engineering, vol. 119, 2017, pp. 41-56.
Mu, et al., "Microwave Absorption Properties of Heterostructure Composites of Two Dimensional Layered Magnetic Materials and Graphene Nanosheets", Applied Physics Letters, vol. 115, No. 4, Jul. 24, 2019, pp. 043103-1-043103-5.
Nagashio, et al., "Mobility Variations in Mono- and Multi-Layer Graphene Films", Applied Physics Express, vol. 2, No. 2, Jan. 23, 2009, pp. 025003-1-025003-3.
Nagata, et al., "Superconductivity in the Filamentary Conductor TaSe3", Journal of Physics and Chemistry of Solids, vol. 52, No. 6, 1991, pp. 761-767.
Naghibi, et al., "Noncuring Graphene Thermal Interface Materials for Advanced Electronics", Advanced Electronic Materials, vol. 6, Issue 4, 2020, pp. 1901303-1-1901303-9.
Nie, et al., "Topological phases in the TaSe3 compound", Physical Review B, vol. 98, No. 12, Sep. 26, 2018, pp. 125143-1-125143-6.
Nomura, et al., "Effect of Cu Doping on Superconductivity in TaSe3: Relationship between Superconductivity and Induced Charge Density Wave", Europhysics Letters, vol. 124, No. 6, Dec. 2018, pp. 67001-1-67001-7.
Novoselov, et al., "Electric Field Effect in Atomically Thin Carbon Films", Science, vol. 306, Oct. 22, 2004, pp. 666-669.
Ohayon, et al., "Compression-Enhanced Thermal Conductivity of Carbon Loaded Polymer Composites", Carbon, vol. 163, 2020, pp. 333-340.
Pan, et al., "Percolation Threshold and Electrical Conductivity of a Two-Phase Composite Containing Randomly Oriented Ellipsoidal Inclusions", Journal of Applied Physics, vol. 110, Dec. 27, 2011, pp. 123715-1-123715-5.
Panwar, et al., "Analysis of Electrical, Dielectric, and Electromagnetic Interference Shielding Behavior of Graphite Filled High Density Polyethylene Composites", Polymer Engineering and Science, vol. 48, Issue 11, 2008, pp. 2178-2187.
Plyushch, et al., "Silicon Carbide/Phosphate Ceramics Composite for Electromagnetic Shielding Applications: Whiskers vs Particles", Applied Physics Letters, vol. 114, No. 18, May 10, 2019, pp. 183105-1-83105-5.

(56) References Cited

OTHER PUBLICATIONS

Ram, et al., "Electromagnetic Interference Shielding Effectiveness and Skin Depth of Poly(Vinylidene Fluoride)/Particulate Nano-Carbon Filler Composites: Prediction of Electrical Conductivity and Percolation Threshold", Polymer International, vol. 68, Issue 6, Apr. 2, 2019, pp. 1194-1203.

Ren, et al., "Synergistic Effect of Graphene Nanosheets and Carbonyl Iron-Nickel Alloy Hybrid Filler on Electromagnetic Interference Shielding and Thermal Conductivity of Cyanate Ester Composites", Journal of Materials Chemistry C, vol. 6, No. 6, 2018, pp. 1476-1486.

Repacholi, Michael Harry, "Low-Level Exposure to Radiofrequency Electromagnetic Fields: Health Effects and Research Needs", Bioelectromagnetics, vol. 19, Issue 01, 1998, pp. 1-19.

Saleheen, et al., "Evidence for Topological Semimetallicity in a Chain-Compound TaSe3", Nature Partner Journals Quantum Materials, vol. 5, No. 53, Jul. 24, 2020, pp. 1-8.

Sambongi, et al., "Phase Transitions and Electric Properties of MX3", Department of Physics (* Nuclear Engineering) Hokkaido University, Sapporo 060 Japan, 1979, pp. 349-353.

Sambongi, et al., "Superconductivity in One-Dimensional TaSe3", Journal of the Physical Society of Japan, vol. 42, No. 4, Apr. 1997, pp. 1421-1422.

Shahzad, et al., "Electromagnetic Interference Shielding with 2D Transition Metal Carbides (MXenes)", Science, vol. 353, Issue 6304, Sep. 9, 2016, pp. 1137-1140.

Sharif, et al., "Segregated Hybrid Poly(methyl methacrylate)/Graphene/Magnetite Nanocomposites for Electromagnetic Interference Shielding", ACS Applied Materials & Interfaces, vol. 9, No. 16, Apr. 4, 2017, pp. 14171-14179.

Sharma, et al., "YIG Based Broad Band Microwave Absorber: A Perspective on Synthesis Methods", Journal of Magnetism and Magnetic Materials, vol. 439, 2017, pp. 277-286.

Shen, et al., "Microcellular Graphene Foam for Improved Broadband Electromagnetic Interference Shielding", Carbon, vol. 102, 2016, pp. 154-160.

Shen, et al., "Strong Flexible Polymer/Graphene Composite Films with 3D Saw-Tooth Folding for Enhanced and Tunable Electromagnetic Shielding", Carbon, vol. 113, 2017, pp. 55-62.

Shen, et al., "Ultrathin Flexible Graphene Film: An Excellent Thermal Conducting Material with Efficient EMI Shielding", Advanced Functional Materials, vol. 24, Issue 28, 2014, pp. 4542-4548.

Shtein, et al., "Thermally Conductive Graphene-Polymer Composites: Size, Percolation, and Synergy Effects", Chemistry of Materials, vol. 27, No. 6, Feb. 26, 2015, pp. 2100-2106.

Silva, et al., "Strain Control of the Competition Between Metallic and Semiconducting States in Single-Layers of TaSe3", 2D Materials, vol. 7, No. 2, Mar. 18, 2020, pp. 025038-1-025038-9.

Simon, Robert M, "Emi Shielding Through Conductive Plastics", Polymer-Plastics Technology and Engineering, vol. 17, 1981, Issue 01, Dec. 6, 2006, pp. 1-10.

Song, et al., "Carbon Nanotube-Multilayered Graphene Edge Plane Core-Shell Hybrid Foams for Ultrahigh-Performance Electromagnetic-Interference Shielding", Advanced Materials, vol. 29, No. 31, 2017, pp. 1701583-1-1701583-8.

Song, et al., "Interfacial Engineering of Carbon Nanofiber-Graphene-Carbon Nanofiber Heterojunctions in Flexible Lightweight Electromagnetic Shielding Networks", ACS Applied Materials & Interfaces, vol. 6, No. 13, Jun. 10, 2014, pp. 10516-10523.

Stolyarov, et al., "Breakdown Current Density in h-BN-Capped Quasi-1D TaSe3 Metallic Nanowires: Prospects of Interconnect Applications†", Nanoscale, vol. 8, Issue 24, 2016, pp. 15774-15782.

Tan, et al., "Dependences of Microstructure on Electromagnetic Interference Shielding Properties of Nano-Layered Ti3AlC2 Ceramics", Scientific Reports, vol. 08, No. 01, May 21, 2018, pp. 1-8.

Thomassin, et al., "Polymer/Carbon based Composites as Electromagnetic Interference (EMI) Shielding Materials", Materials Science and Engineering: R: Reports, vol. 74, Issue 7, 2013, pp. 211-232.

Tritt, et al., "Effect of uniaxial stress on the transport properties of TaSe3", Physical Review B, vol. 34, No. 10, Nov. 15, 1986, pp. 6799-6803.

Tritt, et al., "Measure of the Elastic and Transport Properties of TaSe3 through the Stress-Induced Phase Transition.", Physica B, vol. 194-196, Part 1, 1994, pp. 1303-1304.

Verma, et al., "Graphene Nanoplatelets/Carbon Nanotubes/Polyurethane Composites as Efficient Shield against Electromagnetic Polluting Radiations", Composites Part B: Engineering, vol. 120, 2017, pp. 118-127.

Wanasinghe, et al., "Review of Polymer Composites with Diverse Nanofillers for Electromagnetic Interference Shielding", Nanomaterials, vol. 10, No. 541, Mar. 17, 2020, pp. 1-46.

Wang, et al., "Enhanced Dielectric Properties and High-Temperature Microwave Absorption Performance of Zn-Doped Al2O3 Ceramic", Journal of Electronic Materials, vol. 44, No. 07, Apr. 22, 2015, pp. 2353-2358.

Wen, et al., "Reduced Graphene Oxides: Light-Weight and High-Efficiency Electromagnetic Interference Shielding at Elevated Temperatures", Advanced Materials, vol. 26, Issue 21, 2014, pp. 3484-3489.

Wen, et al., "Reduced Graphene Oxides: The Thinnest and Most Lightweight Materials with Highly Efficient Microwave Attenuation Performances of the Carbon World†", Nanoscale, vol. 6, No. 11, 2014, pp. 5754-5761.

Wu, et al., "Modified Carbon Fiber/Magnetic Graphene/Epoxy Composites with Synergistic Effect for Electromagnetic Interference Shielding over Broad Frequency Band", Journal of Colloid and Interface Science, vol. 506, 2017, pp. 217-226.

Xia, et al., "A Theory of Electrical Conductivity, Dielectric Constant, and Electromagnetic Interference Shielding for Lightweight Graphene Composite Foams", Journal of Applied Physics, vol. 120, Issue 8, Aug. 24, 2016, pp. 085102-1-085102-11.

Xia, et al., "Bulk Fermi surface of the layered superconductor TaSe3 with three-dimensional strong topological state", Physical Review B, vol. 101, No. 15,, Apr. 15, 2020, pp. 155117-1-155117-7.

Xie, et al., "Thermal Conductivity, Heat Capacity, and Elastic Constants of Water-Soluble Polymers and Polymer Blends", Macromolecules, vol. 49, No. 3, Jan. 25, 2016, pp. 972-978.

Yamaya, et al., "Electrical Properties of Ta(Sx Se1-x)3", Molecular Crystals and Liquid Crystals, vol. 81, Issue 1, Oct. 14, 2011, pp. 133-140.

Yan, et al., "Efficient Electromagnetic Interference Shielding of Lightweight Graphene/Polystyrene Composite†", Journal of Materials Chemistry, vol. 22, No. 36, 2012, pp. 18772-18774.

Yan, et al., "Structured Reduced Graphene Oxide/Polymer Composites for Ultra-Efficient Electromagnetic Interference Shielding", Advanced Functional Materials, vol. 25, Issue 04, 2015, pp. 559-566.

Yang, et al., "Conductive Carbon Nanofiber—Polymer Foam Structures†", Advanced Materials, vol. 17, Issue 16, 2005, pp. 1999-2003.

Yang, et al., "NiO Hierarchical Nanorings on SiC: Enhancing Relaxation to Tune Microwave Absorption at Elevated Temperature", ACS Applied Materials & Interfaces, vol. 07, No. 33, Mar. 25, 2015, pp. 7073-7077.

Yang, et al., "Novel Carbon Nanotube-Polystyrene Foam Composites for Electromagnetic Interference Shielding", Nano Letters, vol. 5, No. 11, 2005, pp. 2131-2134.

Yang, et al., "Observation of Charge Density Wave Transition in TaSe3 Mesowires", Applied Physics Letters, vol. 115, Jul. 15, 2019, pp. 033102-1-033102-5.

Yang, et al., "Towards Cost-Efficient EMI Shielding Materials using Carbon Nanostructure-based Nanocomposites", Nanotechnology, vol. 18, No. 34, Jul. 27, 2007, pp. 345701-1-345701-4.

Yang, et al., "Ultrathin Flexible Reduced Graphene Oxide/Cellulose Nanofiber Composite Films with Strongly Anisotropic Thermal Conductivity and Efficient Electromagnetic Interference Shielding†", Journal of Materials Chemistry C, vol. 5, No. 15, 2017, pp. 3748-3756.

Yashchyshyn, et al., "A New Method for Dielectric Characterization in Sub-THz Frequency Range", IEEE Transactions on Terahertz Science and Technology, vol. 8, No. 1, Jan. 2018, pp. 19-26.

(56) References Cited

OTHER PUBLICATIONS

Yi, et al., "The Band Structure of The Quasi-One-Dimensional Layered Semiconductor TiS3(001)", Applied Physics Letters, vol. 112, Jan. 30, 2018, pp. 052102-1-052102-4.

Yin, et al., "Electromagnetic Properties of Si—C—N Based Ceramics and Composites", International Materials Reviews, vol. 59, Issue 6, May 19, 2014, pp. 326-355.

Yousefi, et al., "Highly Aligned Graphene/Polymer Nanocomposites with Excellent Dielectric Properties for High-Performance Electromagnetic Interference Shielding", Advanced Materials, vol. 26, Issue 31, 2014, pp. 5480-5487.

Yuan, et al., "Comparison of Electromagnetic Interference Shielding Properties between Single-Wall Carbon Nanotube and Graphene Sheet/Polyaniline Composites", Journal of Physics D, vol. 45, No. 23, 2012, pp. 235108-1-235108-6.

Yuan, et al., "Design of Artificial Nacre-like Hybrid Films as Shielding to Mitigate Electromagnetic Pollution", Carbon, vol. 75, 2014, pp. 178-189.

Yuchang, et al., "Temperature Dependence of the Electromagnetic Properties of Graphene Nanosheet Reinforced Alumina Ceramics in the X-band", Journal of Materials Chemistry C, vol. 04, No. 22, 2016, pp. 4853-4862.

Zamanian, et al., "Electromagnetic Radiation and Human Health: A Review of Sources and Effects", High Frequency Electronics, EMR & Human Health, vol. 04, No. 03, Jul. 2005, pp. 16-26.

Zavalko, et al., "Impurity-Induced Metal-Insulator Transition in Quasi-One-Dimensional Metals TaSe3 and NbSe3", Journal de Physique IV France, vol. 131, 2005, pp. 359-360.

Zhan, et al., "Fabrication of a Flexible Electromagnetic Interference Shielding Fe3O4@reduced Graphene Oxide/Natural Rubber Composite with Segregated Network", Chemical Engineering Journal, vol. 344, 2018, pp. 184-193.

Zhang, et al., "Experimental Observation of the Quantum Hall Effect and Berry's Phase in Graphene", Nature, vol. 438, 2005, pp. 201-204.

Zhang, et al., "Large Magnetoresistance in Topological Insulator Candidate TaSe3", AIP Advances, vol. 10, Sep. 11, 2020, pp. 095314-1-095314-8.

Zhang, et al., "Ordered Multilayer Film of (Graphene Oxide/Polymer and Boron Nitride/Polymer) Nanocomposites: An Ideal EMI Shielding Material with Excellent Electrical Insulation and High Thermal Conductivity", Composites Science and Technology, vol. 136, 2016, pp. 104-110.

Zhang, et al., "Oxidation Stability of Colloidal Two-Dimensional Titanium Carbides (MXenes)", Chemistry of Materials, vol. 29, 2017, pp. 4848-4856.

Zhao, et al., "Flexible, Ultrathin, and High-Efficiency Electromagnetic Shielding Properties of Poly(Vinylidene Fluoride)/Carbon Composite Films", ACS Applied Materials & Interfaces, vol. 9, No. 24, May 30, 2017, pp. 20873-20884.

Zhao, et al., "Synergism between Carbon Materials and Ni Chains in Flexible Poly(vinylidene fluoride) Composite Films with High Heat Dissipation to Improve Electromagnetic Shielding Properties", Carbon, vol. 127, 2018, pp. 469-478.

Zhou, et al., "Temperature Dependence of the Electromagnetic Properties and Microwave Absorption of Carbonyl ron particles/silicone resin composites", Journal of Magnetism and Magnetic Materials, vol. 374, 2015, pp. 345-349.

Al-Saleh, et al., "Electromagnetic Interference Shielding Mechanisms of CNT/Polymer Composites", Carbon, vol. 47, Issue 7, 2009, pp. 1738-1746.

Ameli, et al., "Electrical Properties and Electromagnetic Interference Shielding Effectiveness of Polypropylene/Carbon Fiber Composite Foams", Carbon, vol. 60, 2013, pp. 379-391.

Balandin, Alexander A., "Low-Frequency 1/f Noise in Graphene Devices", Nature Nanotechnology, vol. 08, Aug. 2013, pp. 549-555.

Balandin, et al., "Superior Thermal Conductivity of Single-Layer Graphene", Nano Letters, vol. 8, No. 3, Feb. 20, 2008, pp. 902-907.

Balandin, Alexandra A, "Thermal properties of graphene and nanostructured carbon materials", Nature Material, vol. 10, No. 8, Aug. 2011, pp. 569-581.

Barani, et al., "Graphene Epoxy-Based Composites as Efficient Electromagnetic Absorbers in the Extremely High-Frequency Band", ACS Applied Materials & Interfaces, vol. 12, No. 25, Jun. 1, 2020, pp. 28635-28644.

Barani, et al., "Multifunctional Graphene Composites for Electromagnetic Shielding and Thermal Management at Elevated Temperatures", Advanced Electronic Materials, vol. 6, Issue 11, 2020, pp. 1-12.

Barani, et al., "Thermal Properties of the Binary-Filler Hybrid Composites with Graphene and Copper Nanoparticles" Advanced Functional Materials, vol. 30, Issue 8, 2020, pp. 1904008-1-1904008-11.

Bayat, et al., "Electromagnetic Interference Shielding Effectiveness of Hybrid Multifunctional Fe3O4/Carbon Nanofiber Composite", Polymer, vol. 55, Issue 3, 2014, pp. 936-943.

Bjerkelund, et al., "On the Properties of TaS3 and TaSe3", Acta Chemica Scandinavica, vol. 20, No. 7, 1966, pp. 1836-1842.

Bjerkelund, et al., "On the Properties of TaS3, TaSe3 and TaTe4†", ZAAC—Journal Of Inorganic and General Chemistry, vol. 328, Issue 5-6, 1964, pp. 235-242.

Bloodgood, et al., "Monoclinic Structures of Niobium Trisulfide", APL Materials, vol. 6, 2018, pp. 026602-1-026602-8.

Cai, et al., "Thermal Transport in Suspended and Supported Monolayer Graphene Grown by Chemical Vapor Deposition", Nano Letters, vol. 10, No. 5, 2010, pp. 1645-1651.

Cao, et al., "Ultrathin Graphene: Electrical Properties and Highly Efficient Electromagnetic Interference Shielding", Journal of Materials Chemistry C, vol. 03, Issue 26, 2015, pp. 6589-6599.

Celzard, et al., "Simple Method for Characterizing Synthetic Graphite Powders", Journal of Physics D: Applied Physics, vol. 33, 2000, pp. 1556-1563.

Chang, et al., "Microwave Absorbing Properties of Two Dimensional Materials GeP5 Enhanced after Annealing Treatment", Applied Physics Letters, vol. 114, No. 1, 2019, pp. 013103-1-013103-5.

Chen, et al., "Lightweight and Flexible Graphene Foam Composites for High-Performance Electromagnetic Interference Shielding", Advanced Materials, vol. 25, Issue 09, 2013, pp. 1296-1300.

Chen, et al., "Measurement and Analysis of Thermal Conductivity of Ti3C2Tx MXene Films", Materials, vol. 11, No. 9, Sep. 13, 2018, pp. 1-10.

Cheon, et al., "Data Mining for New Two- and One-Dimensional Weakly Bonded Solids and Lattice-Commensurate Heterostructures", Nano Letters, vol. 17, No. 3, Feb. 13, 2017, pp. 1915-1923.

Chung, Deborah Duen Ling, "Carbon Materials for Structural Self-Sensing, Electromagnetic Shielding and Thermal Interfacing", Carbon, vol. 50, Issue 9, 2012, pp. 3342-3353.

Chung, Deborah Duen Ling, "Electromagnetic Interference Shielding Effectiveness of Carbon Materials", Carbon, vol. 39, Issue 02, 2001, pp. 279-285.

Crespo, et al., "Synergistic Effect of Magnetite Nanoparticles and Carbon Nanofibres in Electromagnetic Absorbing Composites", Carbon, vol. 64, 2014, pp. 63-72.

Dalal, et al., "EMI Shielding Properties of Laminated Graphene and PbTiO3 Reinforced Poly(3,4-ethylenedioxythiophene) Nanocomposites", Composites Science and Technology, vol. 165, 2018, pp. 222-230.

Das, et al., "Single-Walled Carbon Nanotube/Poly(methyl methacrylate) Composites for Electromagnetic Interference Shielding", Polymer Engineering and Science, vol. 49, Issue 8, 2009, pp. 1627-1634.

De, et al., "Electromagnetic Properties of Composites Containing Graphite Nanoplatelets at Radio Frequency", Carbon, vol. 49, Issue 13, 2011, pp. 4291-4300.

Deruelle, Fabien, "The Different Sources of Electromagnetic Fields: Dangers are not Limited to Physical Health", Electromagnetic Biology and Medicine, vol. 39, Issue 2, Mar. 10, 2020, pp. 166-175.

Dvurechenskaya, et al., "Measurements of Shielding Effectiveness of Textile Materials Containing Metal by the Free-Space Transmission Technique with Data Processing in the Time Domain", Metrology and Measurement Systems, vol. XX, No. 2, 2013, pp. 217-228.

(56) References Cited

OTHER PUBLICATIONS

Empante, et al., "Low Resistivity and High Breakdown Current Density of 10 nm Diameter van der Waals TaSe3 Nanowires by Chemical Vapor Deposition", Nano Letters, vol. 19, Jun. 18, 2019, pp. 4355-4361.

Geetha, et al., "EMI shielding: Methods and materials—A review", Journal of Applied Polymer Science, vol. 112, No. 4, Feb. 13, 2009, pp. 2073-2086.

Geim, et al., "Van Der Waals Heterostructures", Nature, vol. 499, Jul. 25, 2013, pp. 419-425.

Geremew, et al., "Current Carrying Capacity of Quasi-1D ZrTe3 Van Der Waals Nanoribbons", IEEE Transactions on Electron Devices, vol. 39, No. 5, May 2018, pp. 735-738.

Geremew, et al., "Unique Features of the Generation-Recombination Noise in Quasi-One-Dimensional van der Waals Nanoribbons†", Nanoscale, vol. 10, Issue 42, 2018, pp. 19749-19756.

Geserich, et al., "Electrical Anisotropy of the Chain-like Conductors NbSe3 and TaSe3", Physica B+C, vol. 143, Issue 1-3, 1986, pp. 174-176.

Ghosh, et al., "Dimensional crossover of thermal transport in few-layer graphene", Nature Materials, vol. 9, No. 7, May 9, 2010, pp. 555-558.

Ghosh, et al., "Extremely high thermal conductivity of graphene: Prospects for thermal management applications in nanoelectronic circuits", Applied Physics Letters, vol. 92, No. 15, Apr. 16, 2008, pp. 151911-1-151911-3.

Gill, J. C., "Dislocations and the Motion of Weakly Pinned Charge-Density Waves: Experiments on Niobium Triselenide Containing Mobile Indium Impurities", Physical Review B, vol. 53, Jun. 15, 1996, pp. 15586-15603.

Gogoi, et al., "Chapter 23—High-Temperature Electromagnetic Interference Shielding Materials", Materials for Potential EMI Shielding Applications, Elsevier, 2020, pp. 379-390.

Guo, et al., "Simultaneous Improvement of Thermal Conductivities and Electromagnetic Interference Shielding Performances in Polystyrene Composites via Constructing Interconnection Oriented Networks Based on Electrospinning Technology", Composites Part A: Applied Science and Manufacturing, vol. 124, No. 105484, 2019, pp. 1-10.

Habib, et al., "Oxidation Stability of Ti3C2Tx MXene Nanosheets in Solvents and Composite Films", Nature Partner Journals, 2D Materials and Applications, vol. 03, No. 01, Feb. 13, 2019, pp. 1-6.

Haen, et al., "Comparison Between Electrical Conductivity of Multelayered NbSe2 and TaSe2 and Filamentary Compounds NbSe3 and TaSe3", Ferroelectrics, vol. 17, Mar. 16, 2011, pp. 447-449.

Hardell, et al., "Biological Effects from Electromagnetic Field Exposure and Public Exposure Standards", Biomedicine & Pharmacotherapy, vol. 62, Issue 02, 2008, pp. 104-109.

Hsiao, et al., "Lightweight and Flexible Reduced Graphene Oxide/ Water-Borne Polyurethane Composites with High Electrical Conductivity and Excellent Electromagnetic Interference Shielding Performance", ACS Applied Materials & Interfaces, vol. 6, No. 13, Jun. 12, 2014, pp. 10667-10678.

Huang, et al., "The Effect of Geometric Factor of Carbon Nanofillers on the Electrical Conductivity and Electromagnetic Interference Shielding Properties of poly(trimethylene terephthalate) Composites: A Comparative Study", Journal of Materials Science, vol. 52, Nov. 7, 2016, pp. 2560-2580.

Incropera, et al., "Introduction to Heat Transfer", 6th Edition, John Wiley & Sons, 2007, pp. 1-960.

Jia, et al., "Recent Progresses of High-Temperature Microwave-Absorbing Materials", Nano, vol. 13, No. 06, Jun. 21, 2018, pp. 1830005-1-1830005-13.

Jiang, et al., "Electromagnetic Interference Shielding Polymers and Nanocomposites—A Review", Polymer Reviews, vol. 59, No. 02, Feb. 8, 2019, pp. 280-337.

Jiang, et al., "Facile, Green and Affordable Strategy for Structuring Natural Graphite/Polymer Composite with Efficient Electromagnetic Interference Shielding", Royal Society of Chemistry Advances, vol. 5, No. 29, 2015, pp. 22587-22592.

Kargar, et al., "Dual-Functional Graphene Composites for Electromagnetic Shielding and Thermal Management", Advanced Electronic Materials, vol. 5, Issue 1, 2019, pp. 1-9.

Kargar, et al., "Thermal Percolation Threshold and Thermal Properties of Composites with High Loading of Graphene and Boron Nitride Fillers", ACS Applied Materials & Interfaces, vol. 10, No. 43, Oct. 9, 2018, pp. 37555-37565.

Kausar, et al., "Effectiveness of Polystyrene/Carbon Nanotube Composite in Electromagnetic Interference Shielding Materials: A Review", Polymer Plastics Technology and Engineering, vol. 56, No. 10, Apr. 13, 2017, pp. 1027-1042.

* cited by examiner

ELECTROMAGNETIC AND THERMAL SHIELDS WITH LOW-DIMENSIONAL MATERIALS

CROSS-REFERENCES TO RELATED APPLICATIONS

This application claims priority to U.S. Application No. 63/114,883 filed on Nov. 17, 2020, which is incorporated herein by reference in its entirety.

TECHNICAL FIELD

The present disclosure generally relates to an electromagnetic interface (EMI) shielding material and method for producing an electromagnetic interface (EMI) shielding material.

BACKGROUND

Rapid miniaturization and a consequent increase in the heat and electromagnetic wave (EM) emission in the densely packed electronic systems make the simultaneous heat management and electromagnetic interference (EMI) shielding crucially important. Any working electronic device is the source of EM radiation. For this reason, the electronic components have to be protected from the intra- and inter-system EM radiations in order to avoid fast degradation and failure. With the universal deployment of wireless communications, portable devices, high-power transmission lines, the environmental EM pollution has become a major concern for human health as well.

Evaluation of the performance of EMI shielding at high temperature is particularly important for certain high-power electronic systems operating in harsh environments. These concerns require development of novel multifunctional materials, which can serve concurrently as an excellent EM shields with the high thermal stability at elevated temperatures. The ability of such materials to act as the thermal interface materials (TIM), which can dissipate heat efficiently, becomes a necessity rather than an extra bonus feature.

SUMMARY

Accordingly, it would be desirable to have multifunctional materials, which can perform both EMI shielding and TIM functions. For example, a low-weight, mechanical stability, resistance to oxidation, flexibility, and ease of manufacturing can be desirable parameters for multifunctional materials' applicability and cost-effective mass production.

In accordance with an aspect, an electromagnetic interface (EMI) shielding material is disclosed comprising a polymer matrix and a van der Waals material embedded in the polymer matrix and forming one-dimensional atomic threads, and wherein the van der Waals material is a trichalcogenide compound.

In accordance with another aspect, the EMI shielding material of further comprises: two-dimensional graphene embedded in the polymer matrix and mixed with the van der Waals material.

In accordance with an aspect, an electromagnetic interface (EMI) shielding material comprising: a polymer matrix and aligned metallic fillers composed of atomic chain bundles of a quasi-one-dimensional (1D) van der Waals material embedded in the polymer.

In accordance with a further aspect, a method is disclosed of producing an electromagnetic interface (EMI) shielding material comprising: embedding a van der Waals material in a polymer matrix, the van der Waals material being one-dimensional atomic threads.

BRIEF DESCRIPTION OF THE DRAWINGS

FIGS. 6(a)-6(d) illustrate thermal properties of the graphene composites, wherein FIG. 6(a) illustrates thermal diffusivity and FIG. 6(b) illustrate thermal conductivity of the composites as a function of graphene loading fraction at room temperature, and wherein the thermal conductivity exhibits a quadratic dependence on the filler loading except near the loading ϕ of approximately 11.4 vol. % where there is plateau-like dependence attributed to the formation of graphene clusters, and FIG. 6(c) illustrates thermal diffusivity and FIG. 6(d) illustrates thermal conductivity of three different composites with the low, medium, and high loading of graphene fillers as a function of temperature, and wherein the thermal diffusivity decreases with temperature, the thermal conductivity remains nearly constant because the increase in the specific heat compensates for the decrease in thermal diffusivity as the temperature rises.

FIG. 7(b) is a SEM image of the bulk $TaSe_3$ used in this work, FIG. 7(c) is an X-ray diffraction (XRD) pattern of the high-quality single crystal $TaSe_3$, and wherein the inset shows a long shot SEM image of the bulk $TaSe_3$ confirming the needle-like structure of the material in the bulk form, FIG. 7(d) are dispersions of $TaSe_3$ after being subjected to probe-type sonication followed by ultrasonic bath, FIG. 7(e) is an SEM image of $TaSe_3$ after liquid phase exfoliation in acetone. Note the needle-like structures of the exfoliated bundles. Optical images of synthesized flexible films of the chemically exfoliated $TaSe_3$ and polymeric matrices of especial UV-polymer (FIG. 7(f)), epoxy resin (FIG. 7(g)), and sodium alginate (SA) (FIG. 7(h)), and wherein FIG. 7(i) are Raman spectra of the $TaSe_3$ before (blue) and after liquid phase exfoliation in acetone (red) and DMF (cyan), the orange curve shows the Raman spectrum of the $TaSe_3$ fillers mixed with SA, and the characteristic Raman peaks of $TaSe_3$ do not change as it is exfoliated or included as filler inside SA polymer.

FIGS. 9(a)-9(b) illustrate EMI shielding characteristics of polymeric composites with different fillers, wherein FIG. 9(a) illustrates the specific EMI shielding efficiency normalized by thickness, and a polymer composite with 90 wt. % of Ag inclusion exhibit the highest SSE/t, and FIG. 9(b), which is the same plot in FIG. 9(a) normalized by the filler weight loading fraction. The $Z_B$ factor indicates composite's shielding effectiveness per aerial density of the filler. The lower the thickness, density, and filler weight loading fraction and higher the total shielding effectiveness, the higher the $Z_B$.

FIG. 10(a) illustrates reflection, absorption, effective absorption, and transmission coefficients of the epoxy composite with 1.3 vol. % $TaSe_3$ fillers, and wherein it is noted that in UHF range, only 0.0002% of the incident EM wave is transmitted, and FIG. 10(b) illustrates reflection, absorption, and total shielding effectiveness of the same composite, and wherein it is noted that absorption is the dominant mechanism in blocking the EM waves in UHF band, and the legend shows the shielding effectiveness of the pristine epoxy for comparison.

FIG. 11(a) illustrates a crystal structure of $TaSe_3$ (blue=Ta, red=Se) with two views illustrating interchain interactions and emphasizing this material's 1D nature originating from chains extending along the b-axis, FIG. 11(b) schematic of the CVT process employed here to prepare $TaSe_3$ crystals (top) and a photograph of an as-synthesized mass of crystals removed from its growth ampule (below), FIG. 11(c) SEM image of $TaSe_3$ crystals highlighting their high aspect ratio, and FIG. 11(d) secondary electron (SE) image of a $TaSe_3$ nanowire produced by solvent exfoliation.

FIGS. 13(a)-13(b) illustrates a front-view schematic of the standard WR-90 waveguide and polarization of the allowed fundamental $TE_{10}$ mode propagating in this type of waveguide at a given frequency range, wherein FIG. 13(a) illustrates at α=0°, the bundles of the quasi-1D atomic chains are parallel to the large side of the aperture and perpendicular to the electric field of $TE_{10}$ mode, and FIG. 13(b) illustrates at α=90°, the bundles of the quasi-1D atomic chains are perpendicular to the large side of the aperture and perpendicular to the electric field of $TE_{10}$ mode.

As shown in FIG. 16(b) the reflection is highly correlated with sample orientation whereas absorption varies weakly.

DETAILED DESCRIPTION

Figures 1A, 1B, 1C, 1D, 1E, 1F, 1G, 1H:
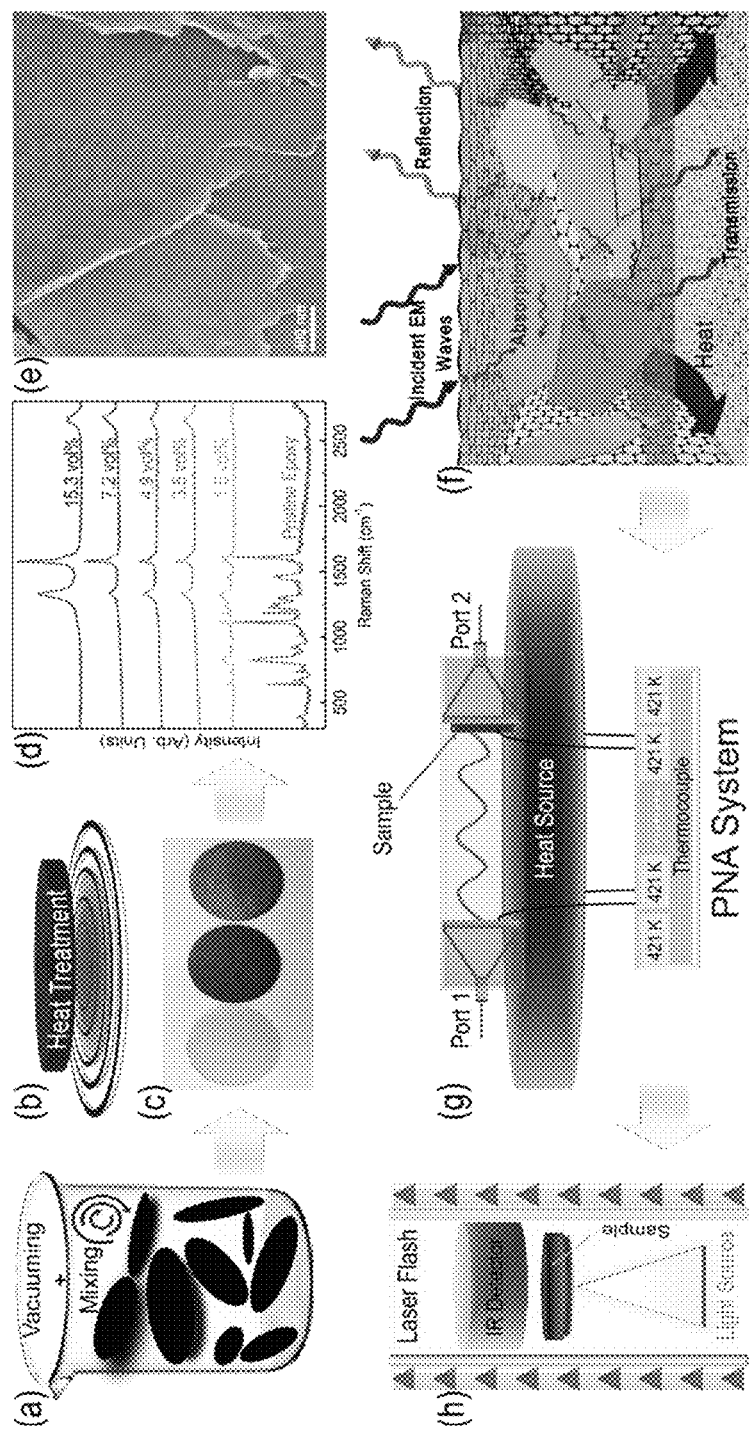
FIGS. 1($a$)-1($h$) illustrate a process flow for the sample preparation and characterization, wherein FIG. 1($a$) illustrates mixing and vacuuming few-layer graphene (FLG) with an epoxy resin and hardener, the mixture is left to solidify for approximately 8 hours at room temperature (RT), FIG. 1($b$) illustrates heat treatment of cured samples at 120° C. for approximately 1 hour, FIG. 1($c$) illustrates left to right, optical image of a pristine epoxy sample, and an epoxy sample with 10.5 vol. % and 17.6 vol. % loading of FLG, FIG. 1($d$) illustrates Raman spectra of epoxy with various FLG filler loadings, FIG. 1($e$) is an SEM image of a composite with 17.6 vol. % of FLG fillers, revealing filler overlapping inside the matrix, FIG. 1($f$) is a schematic showing the interaction of the EM waves with the composite, FIG. 1($g$) is a schematic of the experimental setups for the temperature dependent EMI shielding measurements, and FIG. 1($h$) illustrate thermal conductivity measurements.

The present disclosure relates to a design and methods of preparation of polymer-based composites and thin-film coatings with fillers implemented with the low-dimensional van der Waals materials, including graphene (two-dimensional material) and $TaSe_3$ (one-dimensional material). The term van der Waals material can include all layered materials with week van der Waals bonds that can be chemically exfoliated into strongly covalently bonded atomic planes (like graphene) or atomic chains (like $TaSe_3$). The design of the composites includes specific material selection for the composite base material and fillers, densities, loading fractions of the fillers, filler exfoliation and distribution, orientation, and thickness of the composite films. The design of the composites allows one to achieve electromagnetic interference (EMI) shielding over a wide frequency range, from MHz to hundreds of GHz, while simultaneously providing thermal shielding, e.g., removal of the absorbed EM energy converted to heat. In addition, the design of the composite allows one to achieve EMI shielding via mostly EM wave reflection or EM absorption. The reflection/absorption property can also be tuned for specific application. In addition, efficient EMI shielding can be achieved in the composite or coating, which by itself is electrically insulating, unlike commercially available EMI shields, which are electrically conductive.

In accordance with an embodiment, a polymeric film is disclosed with few-layer graphene (FLG) fillers, for example, of 25 micrometer lateral dimensions and nanometer thickness with the loading of 19.5 vol. %, and thickness of 1 mm, which provides 65 dB EMI shielding in the frequency range from 8.2 GHz to 12.4 GHz (X-band). The design of the composite allows, for example, for simultaneous thermal shielding owing to the high thermal conductivity of the composite. In accordance with an embodiment, the polymeric film can have a thickness, for example, from a few µm range to cm range. For example, the filler loading can be from approximately 1 vol. % to 50 vol. %. In addition, the thickness of the FLG filler can be, for example, from 0.35 nm (single layer graphene) to approximately 20 nm. In accordance with an embodiment, the FLG filler includes a mix of different thicknesses. For example, the lateral dimensions of the FLG filler can be, for example, 100 nm to 50 µm. In addition, it can be that a lateral dimension of the FLG filler is above the phonon mean free path (MFP), which is approximately 800 nm.

In accordance another embodiment, oriented fillers, for example, FLG with a predominantly vertical alignment can result in small reflection of EM energy back to the space. In addition, almost all EMI energy is absorbed after multiple reflections inside the composite. The same fillers remove generated heat due to their high thermal conductivity. The change in the degree of the filler orientation allows one to control the amount of reflected and absorbed EM energy. The horizontal alignment of the fillers results in the maximum reflection.

In accordance with a further embodiment, one-dimensional (1D) fillers, for example, van der Waals materials can be used to achieve efficient EMI shielding and heat conduction functionality. The 1D fillers, for example, can be made of transition metal trichalcogenides ($MX_3$, where M=V, Nb, Ta, or other transition metal; X=S, Se, Te) and their alloys. The transition metal trichalcogenides differ substantially from both conventional metals such as Cu, Al and Co, and from 2D transition metal dichalcogenides, and can have an ultra-high current density with a low resistivity robust metallic materials that can be scaled to well below 10 nm wire widths. The wire width reduction comes from the monoclinic structure of $MX_3$. For example, the trichalcogenide compound $TaSe_3$ consists of Ta—$Se_3$—Ta—$Se_3$—Ta— . . . chains, in which the central Ta atoms form a conducting chain that is shielded by the Se-trimers from surrounding chains. The quasi-1D atomic threads are weakly bound in bundles by van der Waals forces; thus, there are no dangling or unsaturated bonds at the bundle surface. The 1D van der Waals (vdW) metals can be single crystal in the wire direction over µm to mm length scale. In addition, electrical transport experimental studies demonstrated the extraordinary current-carrying capacity of 1D vdW metals to be more than 10 times larger than that of Cu. It has also been shown that unlike in conventional Cu or Al interconnects the resistivity of 1D vdW metals does not increase with decreasing cross-sectional area. In accordance with one embodiment, 1D van der Waals materials can be used, for example, in strictly determined loading fractions, length and diameters, for EMI and thermal shielding. In accordance with an embodiment, the cross-sectional dimensions of the one-dimensional (1D) fillers can be, for example, from 1 nm×1 nm (individual atomic chain) to approximately 100 nm×100 nm. In accordance with another embodiment, the filler mix of the one-dimensional (1D) fillers can have cross-sectional dimensions, for example, from 1 nm×1 nm to approximately 10 nm×10 nm. In addition, the filler length of the one-dimensional (1D) fillers can be, for example, from approximately 1 µm to 1 cm, and, a length, for example, from approximately 10 µm to 1 mm.

In accordance with another embodiment, an EMI shielding material is disclosed that can consists of layers with different fillers. For example, a top layers can be optimized for better EMI shielding while the inside layer can be optimized for the maximum heat removal. In accordance with an embodiment, the thicknesses of the layers of the EMI shielding material can be, for example, from approximately 0.1 µm to 10 cm.

In accordance with a further embodiment, an EMI and thermal shield composite is disclosed where the 2D few-layer graphene fillers are mixed with 1D van der Waals fillers.

Graphene and FLG Fillers

The materials synthesis processes and quality control steps for epoxy-based composites with graphene and FLG fillers are illustrated in FIGS. 1(a)-1(e). The samples were synthesized with the commercially available graphene powder (xGnP, grade H, XG-Sciences, USA) and epoxy (Allied High-Tech Products, Inc.). Graphene fillers with a larger aspect ratio provide relatively high EMI shielding efficiency and thermal conductivity, which helps with the selection of the graphene powder with the largest average lateral dimensions of the flakes. A representative scanning electron microscopy (SEM) image of FLG utilized in the composite preparation confirming the lateral dimensions of the FLG fillers in the range of approximately 15 µm to 25 µm. In order to prepare composites with different filler concentrations, FLG powder was added to epoxy resin in certain amounts, followed by the addition of the hardener. The compound was mixed using a high shear speed mixer in several steps to obtain a uniform dispersion. The mixture was vacuumed several times at least for 15 minutes at each step, in order to remove any possible voids or air bubbles. The final mixture was poured into round molds, gently pressed, and left to solidify at room temperature (RT) for approximately 8 hours. After curing, the samples were placed to a furnace for approximately 1 hour at 120° C. (FIGS. 1(a)-1(b)). It should be noted that in the EMI shielding experiments, the thickness of the sample affects its absorption and thus, its total shielding efficiency. Therefore, for detailed comparison, all samples were polished down to the same thickness of approximately 1.00 mm. An optical image of the pristine epoxy and the composite with 11.4 vol. % and 15.3 vol. % of graphene fillers is shown in FIG. 1(c).

The quality of the samples was verified by the SEM inspection and Raman spectroscopy. Raman spectra of representative samples with different graphene loadings are shown in FIG. 1(d). The intensity of the characteristic Raman peaks of graphene, namely the G peak at approximately 1570 cm$^{-1}$ and 2D band at 2700 cm$^{-1}$, increases as more graphene is loaded to the epoxy. These two peaks are not distinguishable in the samples with graphene loading less than $\phi \leq 1.5$ vol. %. The variations in the graphene filler concentration and their overlap are clearly seen in the SEM image of the composite with 15.3 vol. % of the fillers (see FIG. 1(e)). The data confirm that at high loadings, graphene fillers overlap forming the electrically percolated networks. The filler attachments and percolation strongly affects the electrical and thermal characteristics of the composites, and finally their EMI shielding performance at RT and above. The process of EM wave interaction with the graphene composite is illustrated in FIG. 1(f). Large hexagons indicate FLG fillers. A fraction of the incident EM wave is reflected at the air-composite interface. A part of the EM wave, which passes through the composite's interface, is absorbed directly or after multiple internal reflections inside the composite. Only a small fraction of the incident EM wave is transmitted through the samples. The absorption of EM waves results in the increase of the composite's temperature, which explains the need for high thermal conductivity of EMI shielding material. In the schematic, the red arrows indicate the highly conductive paths for heat dissipation through the fillers inside the epoxy polymer base. The EMI shielding efficiency and the cross-plane thermal conductivity of the samples were measured using a programmable network analyzer and a "laser flash" instrument. The schematic and operational principles of both systems are shown in FIGS. 1(g)-1(h).

EMI Shielding

To determine EMI characteristics, the scattering parameters, $S_{ij}$, were measured using the two-port PNA system at RT and higher temperatures. The indices i and j represents the ports, which are receiving and emitting the EM waves. Each port can simultaneously emit and detect the EM waves and thus, the results of the measurements include four parameters of $S_{11}$, $S_{12}$, $S_{21}$, and $S_{22}$. Given that the samples are symmetrical, one can expect that $|S_{11}|=|S_{22}|$ and $|S_{12}|=|S_{21}|$. The scattering parameters are related to the coefficients of reflection, $R=|S_{11}|^2$, and transmission, $T=|S_{21}|^2$. Knowing these two coefficients, one can obtain the coefficient of absorption, A, according to A=1−R−T. This is because for any EM wave incident on the sample, a fraction is reflected at the interface. A part of EM wave, which enters the composite, is absorbed and the rest is transmitted. The coefficient of absorption, which is defined as the power percentile of the absorbed EM way in the medium to the total power of incident wave, is not truly indicative of material's ability in absorbing the EM waves. This is because some part of the wave is reflected at the interface prior to entering the medium. For this reason, the effective absorption coefficient, $A_{eff}$, is defined as $A_{eff}=1-R-T/1-R$. After determining R, T, and $A_{eff}$, the shielding efficiency of the material can be calculated.

Figures 2A, 2B:
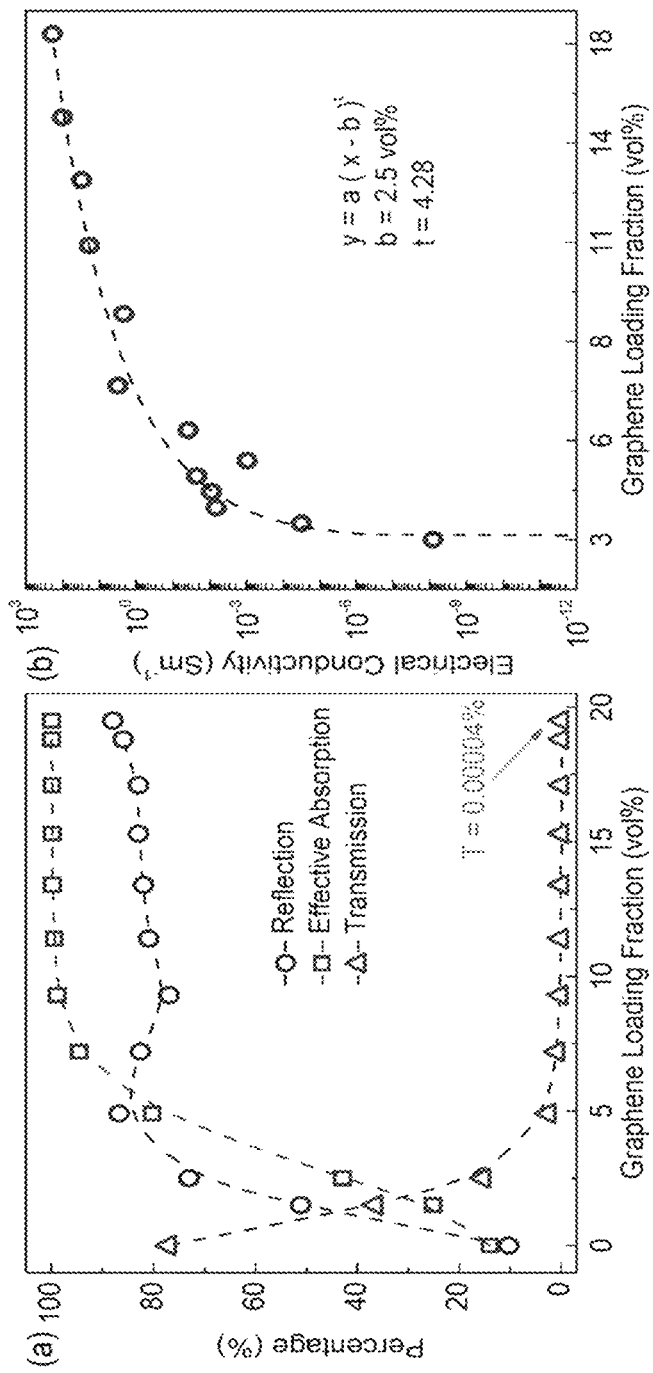
FIG. 2($a$) illustrate coefficients of reflection (R), effective absorption ($A_{\mathit{eff}}$), and transmission (T) as a function of filler loading at f=9.0 GHz, and wherein the rate of variation of R, $A_{\mathit{eff}}$, and T becomes smaller for $\phi$>2.5 vol. %, and FIG. 2($b$) illustrates a bulk in-plane electrical conductivity versus filler loading, wherein the electrical percolation threshold is extracted at $\phi_{th}$=2.5 vol. % via fitting the experimental data using $\sigma \sim (\phi - \phi_{th})^t$.

FIG. 2(a) shows the coefficients of R, $A_{eff}$, and T of the epoxy composites as a function of graphene loading fraction at a representative frequency of ff=9 GHz. The main observation is that addition of even small loading of graphene results in rapid increase in the reflection and affective absorption, and a corresponding decrease in transmission. For the filler concentrations greater than $\phi>2.5$ vol. %, the rate of change for all three coefficients becomes small. The reflection increases from approximately 10% for pristine epoxy to approximately 85% for the samples with $\phi \geq 4.9\%$ and remains constant with negligible variations at higher loading fractions. The effective absorption exhibits a similar trend, showing an abrupt increase from 42% at $\phi=2.5$ vol. % to 80% at $\phi=4.9\%$, and an asymptotical approach to 100% at the higher loadings. At a high loading of $\phi=19.5$ vol. %, the blocking of EM waves by reflection and absorption becomes so strong that only 0.00004% of the incident wave is transmitted through the medium (FIG. 2(a), black triangles). The calculated R, T, A, and $A_{eff}$ as a function of the frequency for the samples with different FLG concentrations.

In accordance with an another embodiment, the attenuation of EM in a conductive medium is related to the skin depth, δ. In good conductors, $\delta=(\pi f \mu \sigma)^{1/2}$ wherein f, µ and σ are the EM wave frequency, medium's permeability and electrical conductivity, respectively. Graphene and FLG are good conductors of electricity. The sheet resistance of SLG and FLG vary from approximately 100Ω up to 30 kΩ depending on the number of layers and quality. Pristine epoxy, on the other hand, is an electrical insulator with the conductivity in the order of approximately $10^{-16}$ Sm$^{-1}$. Addition of FLG to the epoxy, increases the composite's electrical conductivity after the establishment of the percolation network of the fillers. The results of the standard four-probe in-plane electrical conductivity measurements of the epoxy with FLG as a function of the filler loading are presented in FIG. 2(b). The abrupt change in conductivity observed at $\phi=2.5$ vol. % indicates the onset of the electrical percolation where the large FLG fillers inside the insulating polymer matrix create an electrically conductive network. Electrical percolation is theoretically described by power scaling law, $\sigma \sim (\phi-\phi_{th})^t$, where $\phi_{th}$ is the filler loading fraction at the electrical percolation threshold, and t is the "universal" critical exponent. The coincidence of the electrical percolation threshold shown in FIG. 2(b) and the filler loading at which the abrupt change in the effective absorption and transmission is observed demonstrate the correlation among these parameters.

In accordance with a further embodiment, the total shielding efficiency, $SE_T t$, describes the total attenuation of the incident EM wave as it hits and passes through the composite. This parameter determines the material's ability to block the EM waves and consists of two terms of reflection loss, or reflection shielding efficiency, $E_R$, and absorption loss, or absorption shielding efficiency, $SE_A$. These parameters can be calculated in terms of R, T, and $A_{eff}$ as follows $$SE_R=10\ \log[P_i/(P_i-P_r)]=-10\ \log(1-R) \quad (1)$$

$$SE_A=10\ \log[(P_i-P_r)/(P_i-P_rR_a)]=10\ \log(1-A_{eff}) \quad (2)$$

$$SE_T=10\ \log(P_i/P_t)=SE_R+SE_A \quad (3)$$

where $P_i$, $P_r$, $P_a$, and $P_t$ are the power of incident, reflected, absorbed, and transmitted EM wave, respectively.

Figures 3A, 3B, 3C, 3D:
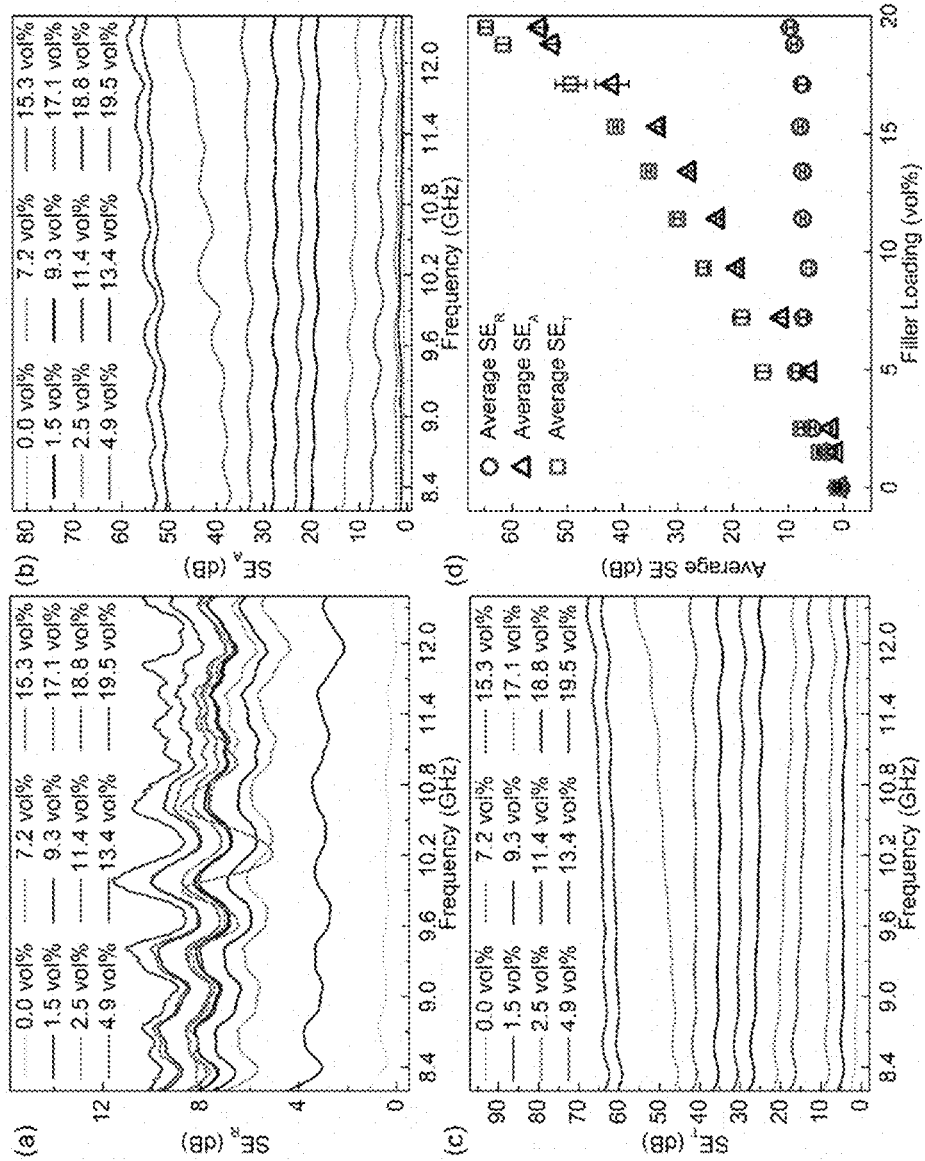
FIG. 3($a$) illustrates a reflection ($SE_R$), FIG. 3($b$) illustrates absorption ($SE_A$), FIG. 3($c$) illustrates total electromagnetic interference efficiency ($SE_T$) of the composite of 1 mm thickness in the frequency range from 8.0 GHz to 12.4 GHz at different graphene loading fractions, and wherein with increasing graphene loading, the EMI shielding efficiency of the composites improves significantly, and the total EMI shielding of the composites reaches to approximately 65 dB at 19.5 vol. % of the graphene filler concentration, and FIG. 3($d$) illustrates average reflection (red circles), absorption (blue triangles), and total EMI shielding (green squares) of composites as a function of graphene loading over the entire X-band frequency.

FIGS. 3(a)-3(c) shows $SE_R$, $SE_A$, and $SE_T$ of the samples as the functions of the graphene filler loading. As more fillers are loaded to the pristine epoxy polymer, $SE_R$ rapidly increases (FIG. 3(a)). At $\phi \geq 2.5$ vol. %, the enhancement in reflection becomes slower, and the $SE_R$ saturates, i.e. it does not increase significantly with more graphene loading. The reflection efficiency is directly related to the surface electrical conductivity or, in other words, the concentration of free charge carriers at or near the interface. The saturation behavior of $SE_R$ indicates that the large graphene fillers are overlapping at the surface of the sample, increasing the overall electrical conductivity of the sample by orders of magnitude as compared to that of pristine epoxy or composites with low loading. Note that at $\phi=2.5$ vol. %, R approximately 73% indicating that most part of the incident EM wave is already reflected back at the interface. In contrast, $SE_A$ increases with adding more fillers (FIG. 3(b)). In samples with $\phi \geq 2.5$ vol. %, the absorption loss becomes the dominant shielding mechanism, which can be seen at higher filler loadings where $SE_A$ approaches 52 dB at $\phi=19.5$ vol. % meaning that almost all the remaining fraction of the EM wave, which passes through the medium after reflection, is being absorbed by the composites. FIG. 3(c) presents the total EMI shielding efficiency of the samples as a function of the graphene loading. The average reflection, absorption, and total shielding efficiency of composites over the complete X-band frequency range as a function of graphene loading are shown in FIG. 3(d). As it is seen and described previously, the reflection loss (red circles) initially increases but then saturates and becomes almost constant at $\phi \geq 2.5$ vol. % whereas the absorption and thus, total shielding efficiency continue to increase with addition of more fillers. In accordance with an aspect, the difference in behavior can be noted in that reflection is mostly a surface phenomenon while absorption happens based on the volume of the composite. The electrically conducting percolation network forms at the surface at lower graphene loading than in the volume of the material.

Figures 4A, 4B, 4C, 4D:
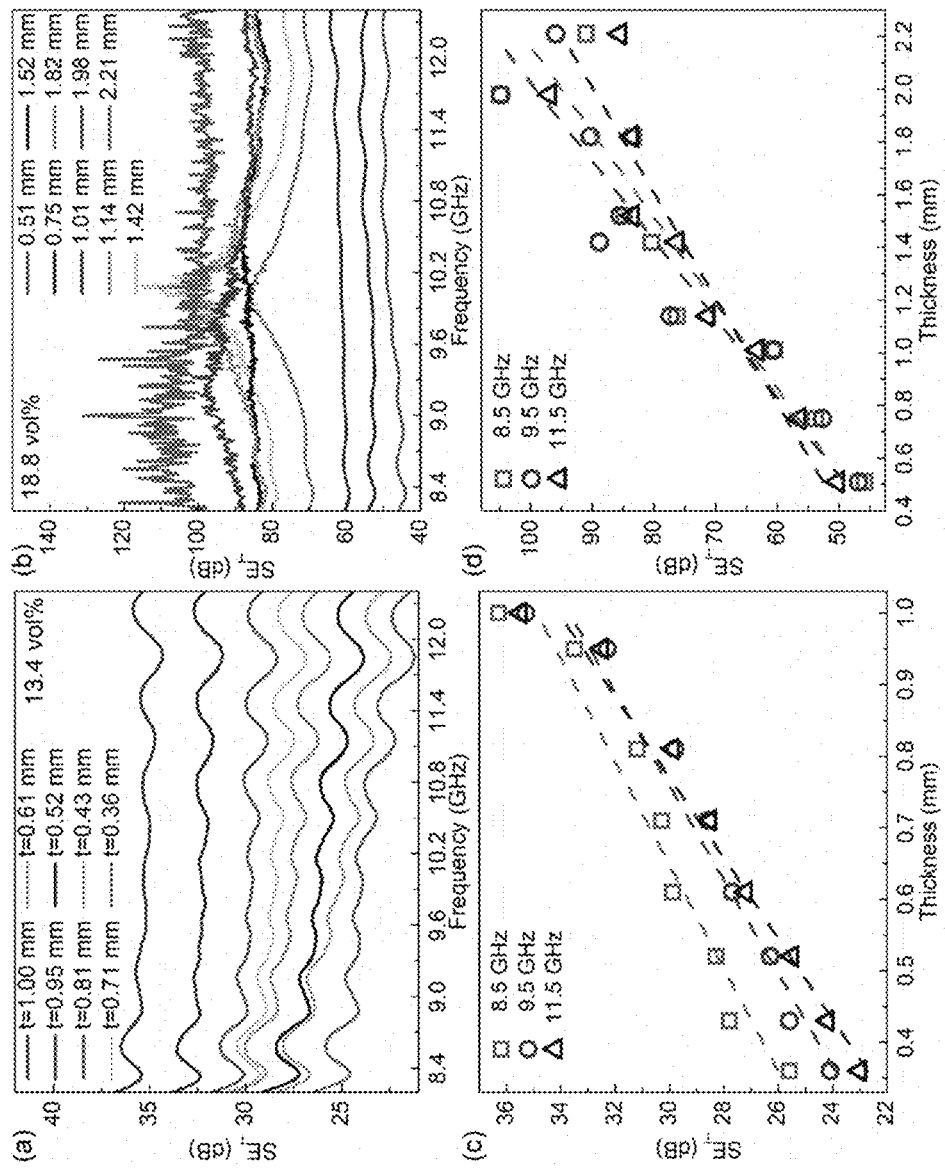
FIGS. 4($a$)-4($d$) illustrates a total EMI shielding of epoxy composites with 13.4 vol. % (FIG. 4($a$)) and 18.8 vol. % (FIG. 4($b$)) graphene filler loading as a function of frequency at different thicknesses, and the total EMI shielding of the epoxy composites with 13.4 vol. % (FIG. 4($c$)) and 18.8 vol. % (FIG. 4($d$)) loading of the filler versus the thickness of the composites at frequencies of 8.5, 9.5, and 11.5 GHz, and wherein the EM shielding increases linearly with increasing the thickness of the composite owing to the increase in shielding by absorption.

In FIGS. 4(a)-4(b), the EMI shielding efficiency is illustrated as a function of the thickness for the epoxy composites with 17.1 vol. % and 18.8 vol. % graphene loading, respectively. The absorption shielding efficiency is directly related to the thickness of the sample. The classical Simon's equation relates the $SE_A$ to the thickness according to $SE_A=1.7/p)f^{0.5}$ where t [cm] and p [Ωcm] are the sample's thickness and bulk DC resistivity and f[MHz] is the frequency. With the increasing thickness, the $SE_A$ increases, which results in the enhancement of the total EMI shielding efficiency (see Eq. (3)). The dependence of $SE_T$ as a function of the sample's thickness is shown in FIGS. 4(c)-4(d) for the composites with 17.1 vol. % and 18.8 vol. % at the fixed frequencies of 8.5 GHz, 9.5 GHz, and 11.5 GHz. The dashed lines are the fitted linear regression over the experimental data. A clear linear trend is observable in both panels. It should be noted that for the epoxy composite with graphene loading of 18.8 vol. % and thickness of approximately 2 mm, the total shielding efficiency at different frequencies is between 95 dB to 105 dB. The values achieved exceed the EMI shielding requirements for most industrial applications, which are at the level of the total 30 dB shielding efficiency. Another advantage of the graphene-enhanced epoxy composites is that they provide higher EM shielding at much lower weights and with stable mechanical structure as compared to conventional metallic enclosures, which are widely used in electronic packaging.

Densely packed electronics, in addition to emitting undesirable EM waves to the environment, dissipate high amounts of heat, which leads to the increase in temperature of all components in the electronic package. A part of the EM wave, which turns into heat during the absorption process, can be described by the following equation:

$$P=\tfrac{1}{2}\sigma|E|^2+\pi f\varepsilon_0\varepsilon_r''|E|^2+\pi f\mu_0\mu_r''|H|^2 \quad (4)$$

Here, P is the power, $\varepsilon_0$ and $\varepsilon_r''$ the vacuum and imaginary part of medium's relative permeability, and $\mu_0$ and $\mu_r''$ are the vacuum and imaginary part of the medium's relative permeability. The first, second, and the third terms in the right hand side correspond to the Joule heat loss, dielectric loss, and magnetic loss, where the latter is negligible for the epoxy composites with graphene. The temperature-rise in most cases adversely affect the ability of materials in blocking the EM waves. In this regard, the EM shield material must possess a high thermal stability, i.e. preserving its EM shielding characteristics even at elevated temperatures at least up to 500 K, and relatively high thermal conductivity in order to dissipate heat to the environment.

Figures 5A, 5B, 5C, 5D, 5E, 5F:
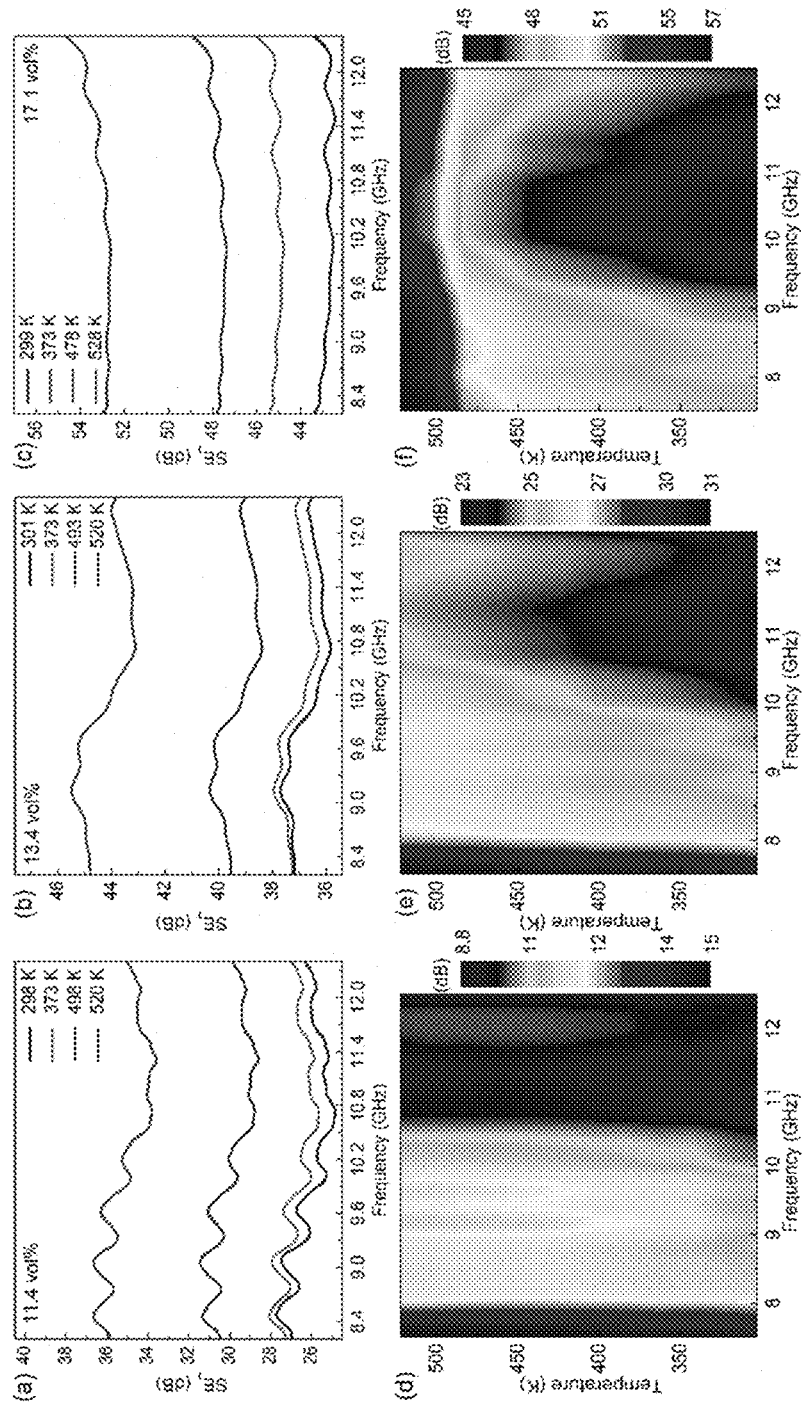
FIGS. 5($a$)-5($f$) illustrates a total EMI shielding efficiency of the epoxy with 11.4 vol. % (FIG. 5($a$)), 13.4 vol. % (FIG. 5($b$)), and 17.1 vol. % (FIG. 5($c$)) of graphene fillers as a function of temperature in the X-band frequency range, and wherein the EMI efficiency increases with temperature in all samples, and the color map of the total EMI shielding efficiency of the composites with 3.5 vol. % (FIG. 5($d$)), 9.3 vol. % (FIG. 5($e$)), and 17.1 vol. % (FIG. 5($f$)) of graphene filler loading as a function of frequency in the temperature range from 303 K to 523 K, and wherein the EMI attenuation for all samples increase as the temperature rises, and the enhancement is more pronounced at higher frequencies.

FIGS. 5(a)-5(c) shows the EM shielding efficiency of three composites with 11.4 vol. %, 13.4 vol. %, and 17.1 vol. % graphene loading at four selected temperatures, in the temperature range from 298 K to 528 K. The total shielding efficiency of the samples enhances by approximately 8 dB for all filler loadings as the temperature increases from RT to approximately 520 K. In FIGS. 5(d-5(f), color maps of $SE_T$ are presented as the function of temperature and frequency for composites with the low (3.5 vol. %), medium (9.3 vol. %), and high (17.1 vol. %) graphene loadings. In contrast to some prior studies, a continuous increase in the $SE_T$ was observed for all filler loadings. The increase in the $SE_T$ is originated mainly from the enhancement in absorption loss rather than increase in the reflection attenuation. The epoxy composites reach the electrical percolation threshold at a rather low FLG concentration, for example, $\phi \sim 2.5$ vol. %. In these samples, the absorption is defined by the electrical conductivity. In a disordered system of randomly dispersed FLG fillers in a polymer matrix, the conductivity by migrating electrons ($\sigma_m$) in the plane of FLG fillers and conductivity by hopping electrons ($\sigma_h$) among the different FLG fillers affect the bulk average electrical conductivity of the composite. The hopping conductance mechanism is generally described as $\sigma_h \sim e^{-(T_0/T)^p}$ where $T_0$ depends on the material's property and p is a parameter defined by the type of hopping. As the temperature increases, the hopping conductivity strongly increases. One should note that it is known that the electrical conductivity in graphite and graphene also increases with rise. For these reasons, both mechanisms of electrical conduction in epoxy-graphene composites enhance with increasing temperature. The latter explains the increase in the absorption and the EMI shielding efficiency at elevated temperatures.

The high thermal stability of epoxy composites laden with FLG fillers provides several advantages over other types of EM shielding materials and fillers, e.g. ceramics, ferromagnets, or MXenes. Ceramic-based composites usually use SiC, which, although thermally stable, has rather poor absorption properties. The ferromagnetic fillers lose their magnetic properties as the temperature passes the Curie temperature, causing the drop in their magnetic shielding characteristics at elevated temperatures. The MXene fillers and films exhibit high shielding efficiencies but prone to formation of oxide layers and reveal poor thermal conductivity making them unsuitable for high-temperature EMI shielding applications.

Thermal Characteristics

Figures 6A, 6B, 6C, 6D:
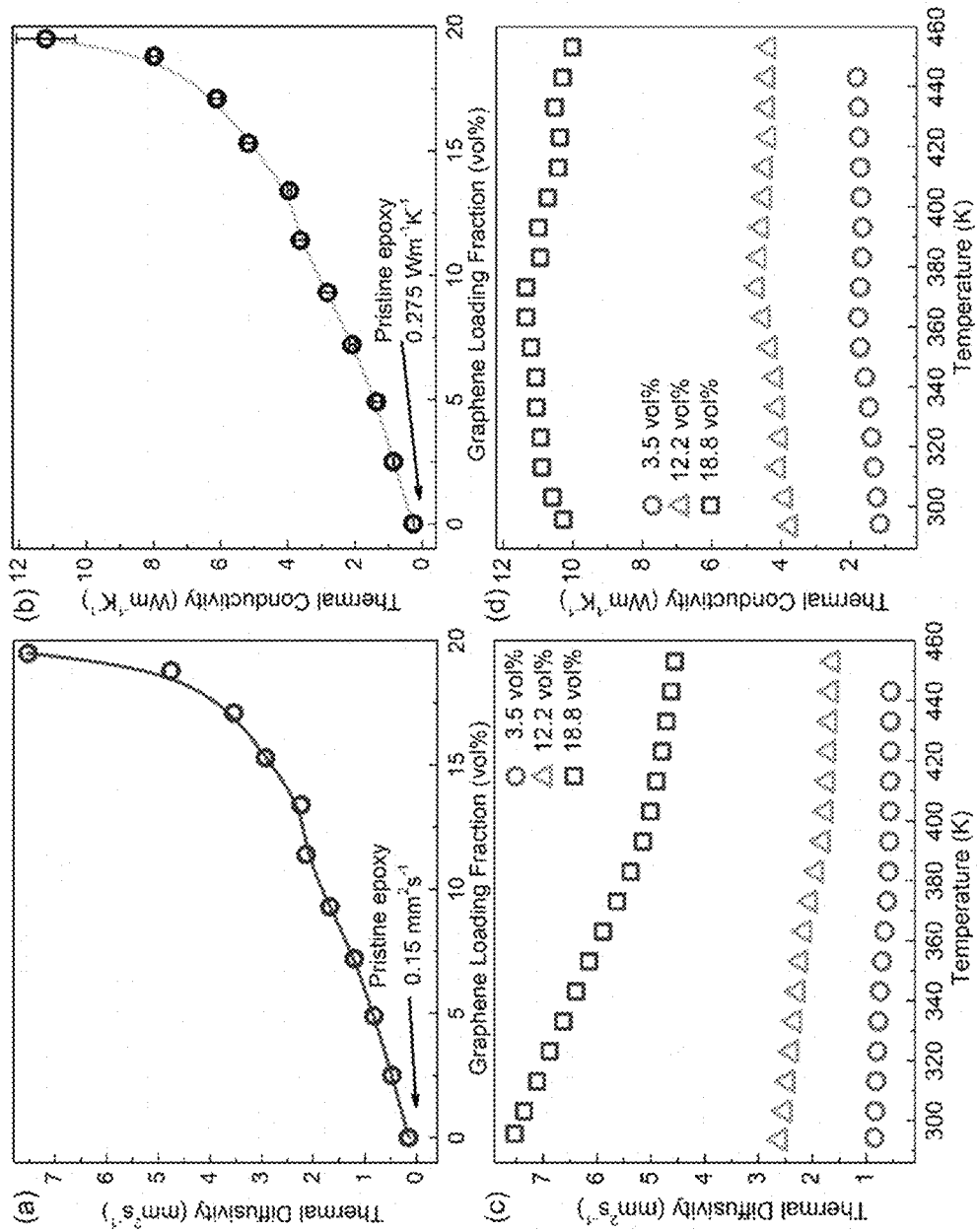

The cross-plane thermal diffusivity and conductivity of the composites at RT and at elevated temperatures were measured using the "laser flash" analysis (LFA, 467 Hyper-Flash, NETZSCH, Germany). The thermal diffusivity, $\alpha\alpha$, was measured directly while the thermal conductivity, K, was calculated as $K=\rho\alpha c_p$, where $\rho$ and $c_p$ are the mass density and the specific heat. FIGS. 6(a)-6(b) illustrate the cross-plane thermal diffusivity and thermal conductivity of the composites as the functions of the graphene loading. Both thermal characteristics, a and K, grow fast with increasing graphene loading. The super-linear, nearly of higher than quadratic, dependence of the thermal characteristics of the composites as the function of the filler loading is attributed to creation of the highly thermally conductive paths of the percolated FLG fillers. One should note that epoxy composites with only 19.5 vol. % FLG loading provide cross-plane thermal conductivity of 11.2±0.9 $Wm^{-1}K^{-1}$, which is comparable to that of the ceramic materials, widely used in high-temperature EMI shielding, specifically for their rather high thermal conductivity and thermal stability. The advantage of graphene composites over conventional ceramics is that their EMI shielding efficiency is much higher and their weigh is much lower than that of conventional ceramics.

In order to investigate the thermal stability of the composites, temperature dependent thermal diffusivity and conductivity experiments in the temperature range between RT to 460 K were conducted and the results of the measurements are presented in FIGS. 6(c)-6(d). The thermal diffusivity of the samples decreases with increasing the temperature. The rate of change is more significant for the composites with higher graphene loadings. However, the thermal conductivity is almost constant owing to the increase in the specific heat as the temperature increases. One should note that the reported data is for the thermal transport properties in the cross-plane direction. The in-plane thermal conductivity of the samples is expected to be much higher because graphene flakes tend to align in the in-plane direction during the fabrication process. The nearly constant high thermal conductivity of the composites over a wide temperature range demonstrates that epoxy with graphene fillers can serve as a multifunctional composite for applications in electronic systems, providing excellent EMI shielding, heat dissipation, mechanical support and adhesion even at elevated temperatures.

The disclosed epoxy-graphene composites exhibit room temperature cross-plane thermal conductivity of 11.2±0.9 $Wm^{-1}K^{-1}$ and the total shielding efficiency of 65 dB at a thickness of t=1 mm at the filler loading of $\phi$=19.5 vol. % in the X-band frequency range of f=8.2 GHZ-12.4 GHz. The EMI shielding and thermal properties of the samples were examined at the temperatures beyond 500 K. The results show that the graphene-epoxy samples preserve their excellent heat conduction properties at high temperatures while the EMI shielding efficiency even improves. The excellent EMI shielding and thermal properties of the multi-functional graphene composites at elevated temperatures along with their thermal stability and light-weight are important for electronic packaging and airborne systems where efficient EMI shielding, low cost, and low weight are required at high temperatures and high-power densities.

EMI Shielding Material with Quasi-1D Van Der Waals Materials

Figures 7A, 7B, 7C, 7D, 7E:
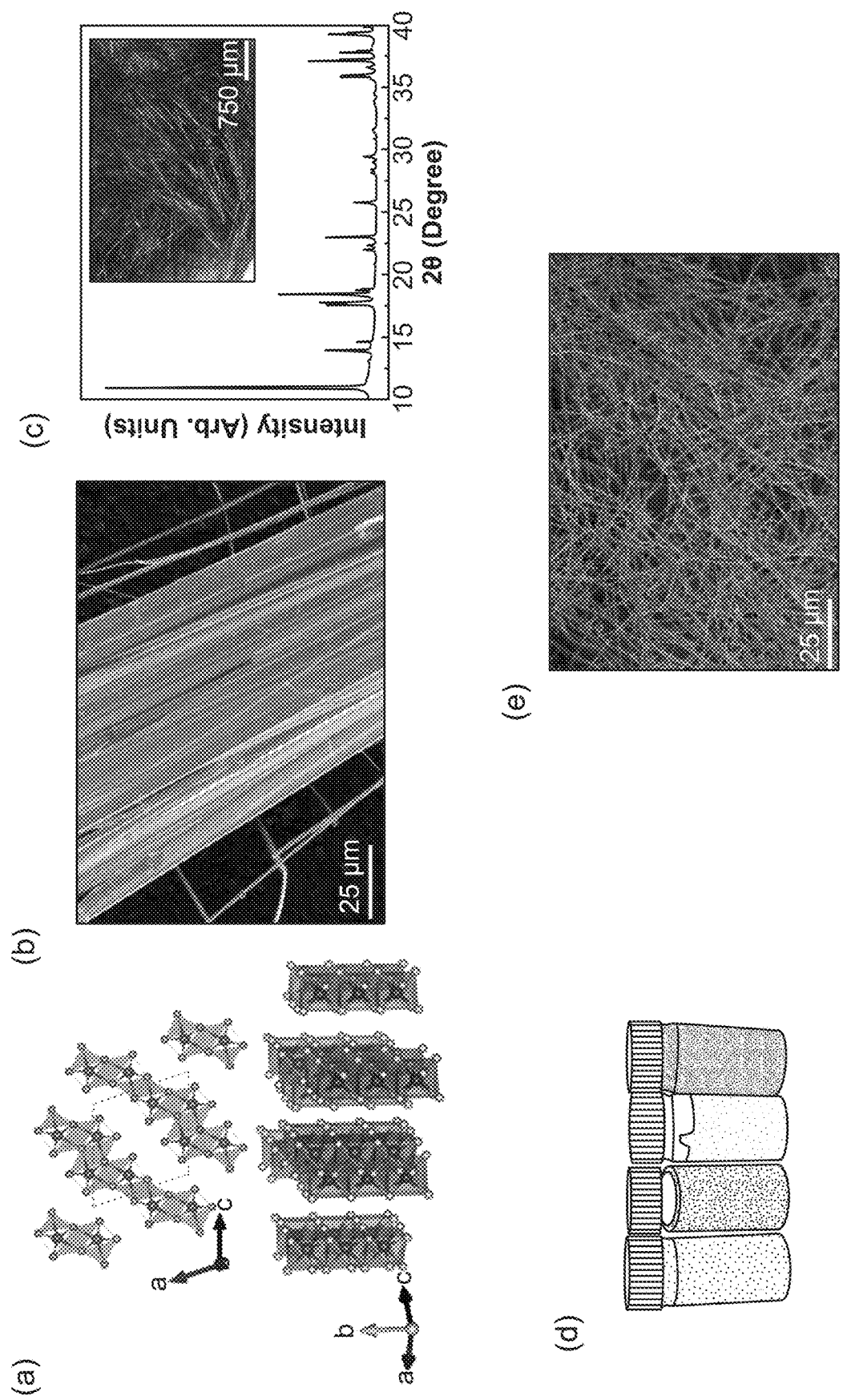
FIGS. 7(a)-7(i) illustrates in FIG. 7(a) crystal structure of monoclinic TaSe3. The top view shows the cross section of the unit cell, perpendicular to the chain axis (b axis), the side view in the bottom panel demonstrates the 1D nature of TaSe3 chains along the b axis.

To demonstrate the function of the EMI shields with quasi-1D van der Waals materials, the composites were prepared using sodium alginate (SA), epoxy, and a UV-light cured polymer (UV-polymer) as the base matrix and monoclinic $TaSe_3$ as the filler. $TaSe_3$ belongs to the class of the transition metal tri-chalcogenide materials ($MX_3$) where M is a transition metal and X is a chalcogenide. These materials exhibit quasi-1D crystalline structure. The crystal structure of the monoclinic $TaSe_3$ is shown schematically in FIG. 7(a). Trigonal prismatic $TaSe_3$ forms continuous chains that extend along the "b" axis, leading to fiber- or needle-like crystals with anisotropic metallic properties. The van der Waals bonding between the chains along the "a" and "c" axes are weak, which allows the $MX_3$ materials to be exfoliated by the mechanical or liquid phase exfoliation methods. An SEM image of the bulk material before the exfoliation is presented in FIG. 7(b). This image shows needle-like structures, which are bundled together. FIG. 7(c) shows the XRD pattern of the $TaSe_3$ crystals confirming the high quality of the $TaSe_3$ material produced. The inset in FIG. 7(c) shows a long-shot SEM image of the bulk material. The length of the needles can vary from several millimeters to centimeters (for example, 1 mm to 10 cm) whereas the diameter of the needle is in the range of tens of micrometers (for example, 10 μm to 200 μm) in the bulk form. The bulk crystals were subjected to the chemical exfoliation separately in two different solvents of acetone and dimethylformamide (DMF). During this process, the bulk $TaSe_3$ is dispersed and exfoliated in the solvents using probe-type sonication and ultrasonic bath. The dispersion was centrifuged, and the procedure of sonication and centrifugation is repeated several times.

Figures 7F, 7G, 7H, 7I:
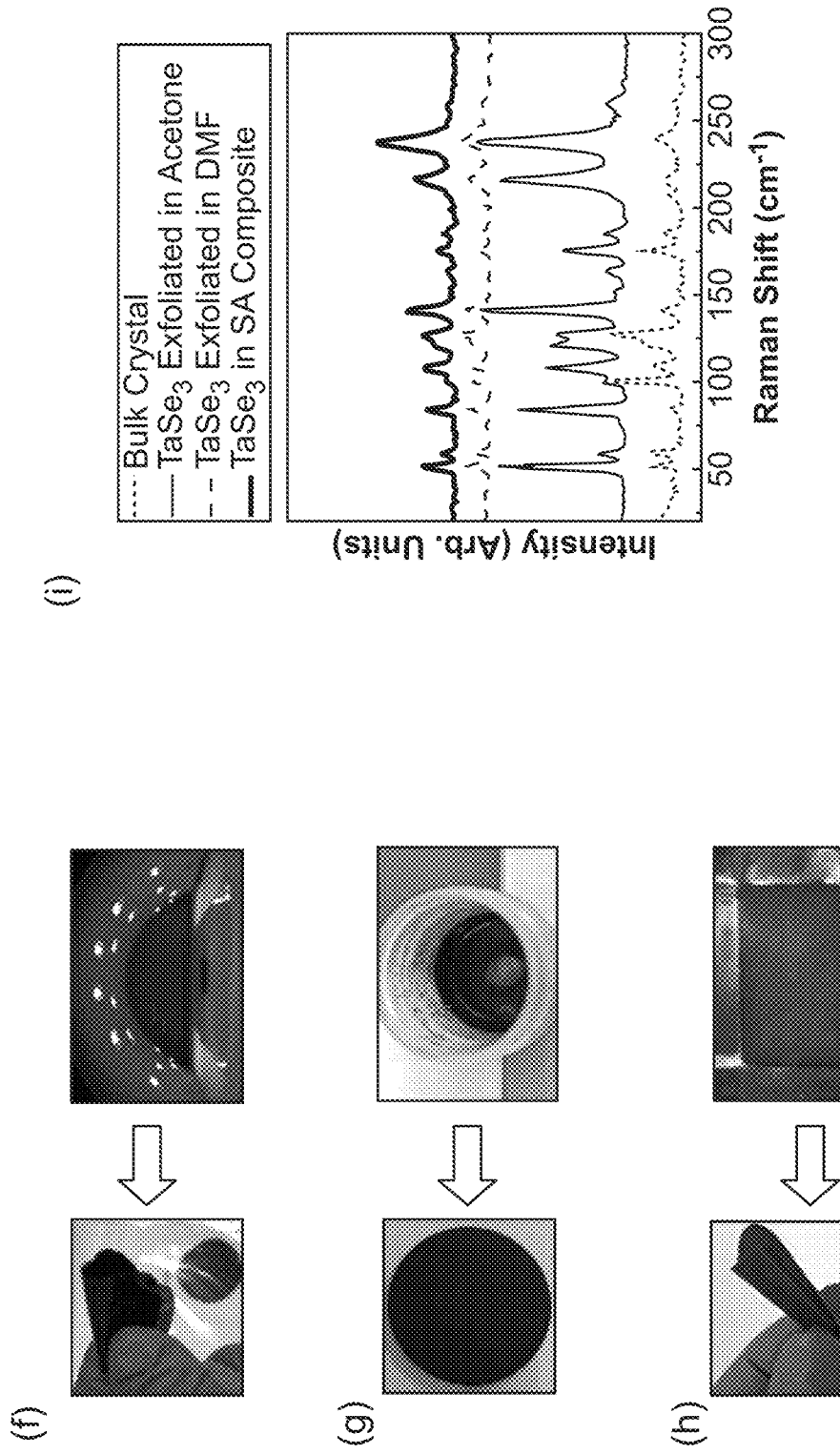
Figures 8A, 8B, 8C, 8D, 8E, 8F:
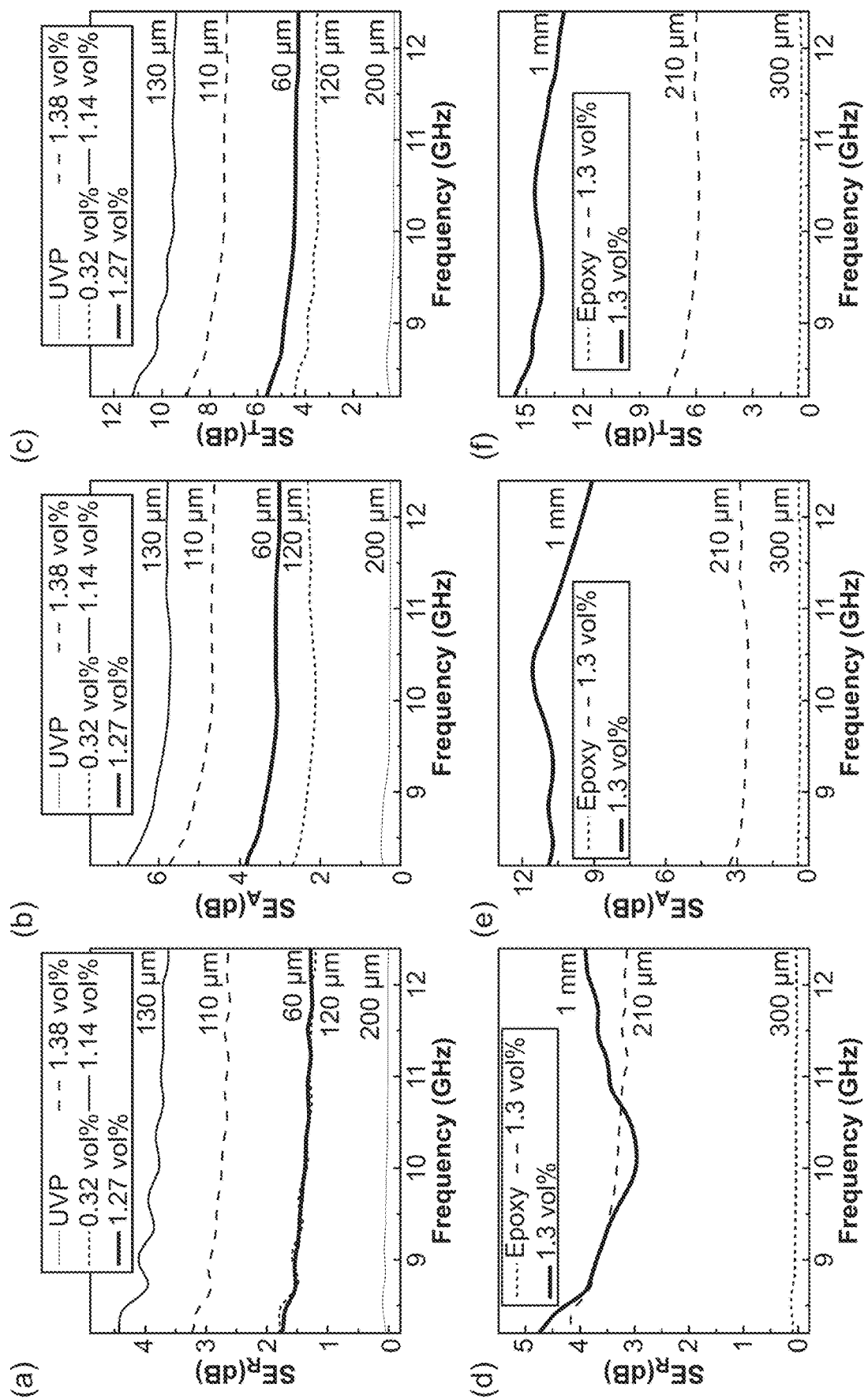
FIGS. 8(a)-8(i) illustrate Electromagnetic characteristics of films with low concentration of quasi-1D $TaSe_3$ fillers in X-band frequency range. Reflection ($SE_R$), absorption ($SE_A$), and total ($SE_T$) electromagnetic interference shielding efficiency of UV-cured polymer (FIGS. 8(a)-8(c)), epoxy (FIGS. 8(d)-8(f)), and sodium alginate films (FIGS. 8(g)-8(i)) and composites with low concentration of quasi-1D $TaSe_3$ bundles of atomic threads as fillers, the concentration is indicated in the legends, it is noted that only 1.3 vol. % of quasi-1D fillers can provide approximately 15 dB shielding efficiency, $SE_T$, in the electrically insulating films (for reference, $SE_T$=10 dB corresponds to blocking 90% of electromagnetic energy).
Figures 8G, 8H, 8I:
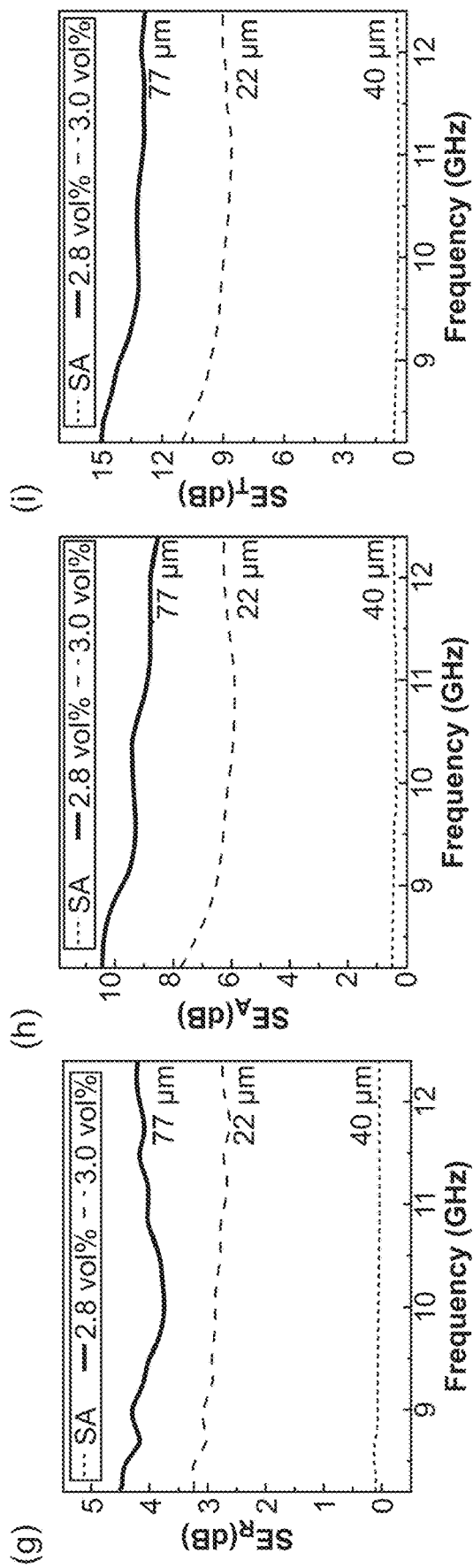

An optical picture of the resultant dispersion at various concentrations is shown in FIG. 7(d). In FIG. 7(d), the concentration of the $TaSe_3$ increases from left to the right. An SEM image of the exfoliated $TaSe_3$ is shown in FIG. 7(e). The diameter of the exfoliated "threads" of $TaSe_3$ ranges from 50 nm to 100 nm while the length of the exfoliated threads of $TaSe_3$ is in the range of several hundred micrometers (e.g., 100 μm to 500 μm). The fillers are then gently mixed with UV-polymer, epoxy, and SA and flexible thin films of samples are synthesized which are shown in FIGS. 7(f)-7(h), respectively. The Raman spectra of $TaSe_3$ before and after exfoliation in different solvents and after mixing with the polymer matrix are shown in FIG. 7(i). As it is seen, the characteristic peaks of $TaSe_3$ does not change before and after exfoliation and even after mixing with the base polymer confirming the stability of the filler.

As seen in FIGS. 8(a)-8(i), 15 dB of total EMI shielding can be achieved in 77-μm thick SA-based films with only 2.8 vol. % of quasi-1D van der Waals fillers. The shielding due to absorption of EM waves is approximately twice as much as that due to reflection of the waves. The fact that the shielding is achieved mostly via absorption versus reflection is beneficial for many practical applications that require minimization of the EM energy redirected back to the environment. The total EMI shielding efficiency $SE=SE_T$, which indicates how much EM energy is blocked by a film of particular thickness, is not the only characteristic that has to be considered for practical purposes. Another commonly used metric is the efficiency normalized by the mass density, $SSE=SE_T/\rho$. However, SSE does not fully describe the EMI shielding of a given material because, by increasing the thickness of a film at a constant mass density, one can achieve higher and higher SSE values. To better describe the EMI shielding at the material level, one can normalize SSE by the thickness, t, and use SSE/t to compare the effectiveness of different composites. Here, for practical purposes, it is meaningful to normalize $SSE/t=SE/(\rho \times t)$ by the loading fraction of the fillers. Achieving higher EMI shielding in the composite with the lowest loading of the fillers makes sense from the weight and cost considerations as well as for maintaining electrical insolation of the composite when required. Indeed, if one composite can deliver the required SE with a low loading of lightweight fillers while another needs 90% loading of silver (Ag) particles, the Ag composite likely will be heavy, expensive and electrically conductive.

Figures 9A, 9B:
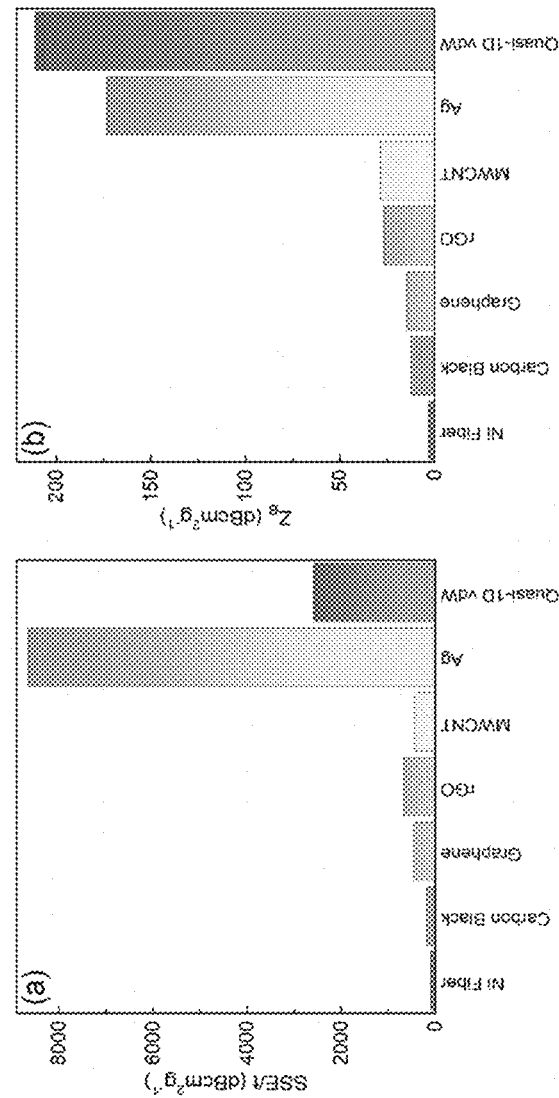

To assess the performance of the polymeric composites with fillers, the figure-of-merit $Z_B=SE/(\rho \times t \phi m_f)$ was defined by introducing normalization by the mass fraction of the fillers $m_f=M_F/(M_B+M_F)$, where MF and MB are the masses of the filler and base polymer, respectively. It is interesting to note that the physical meaning of the $Z_B$ figure-of-merit is the total shielding efficiency of the films per the areal density of the fillers, i.e. $Z_B=SE/(M_F/A)$, here A=V/t is the area of the sample of the volume V and thickness t (see Supplemental for the details of the derivation). The defined metric put more emphasis on the material performance, and specifically the filler performance. FIGS. 9(a) and 9(b) show the SSE/t and $Z_B$ for several polymer composites with different fillers. One can see quasi-1D van der Waals fillers outperforms composites with carbon nanotubes and graphene. Although a composite with Ag has better performance in terms of SSE/t, the composites with quasi-1D fillers exhibit superior $Z_B$ efficiency. The latter means that the polymer composites low areal density of quasi-1D fillers are extremely effective in blocking EM waves.

Figures 10A, 10B:
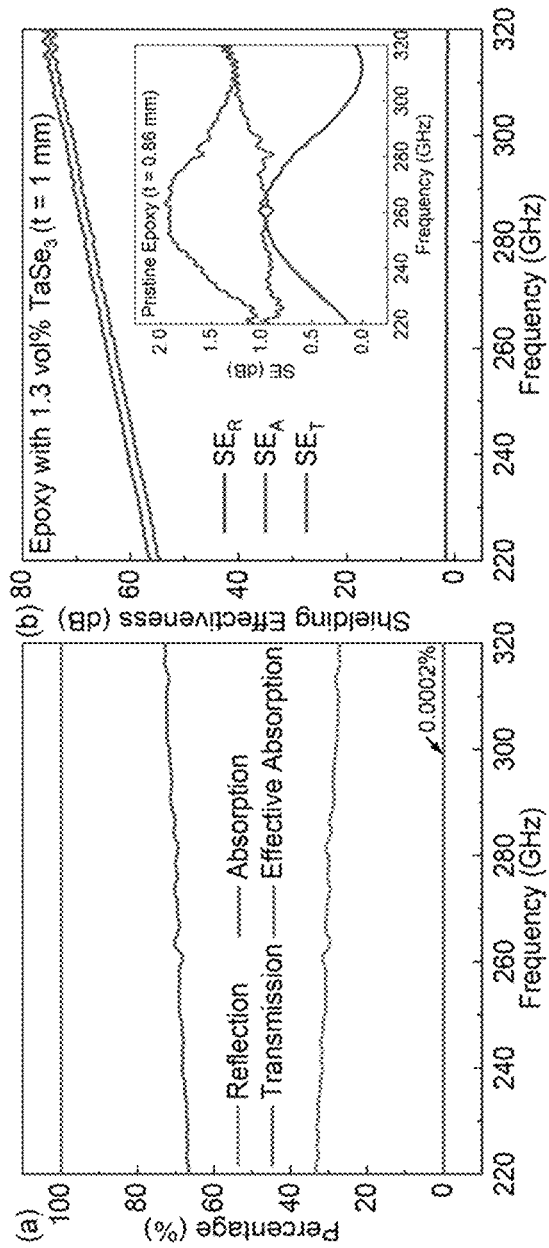
FIGS. 10(a)-10(b) illustrate electromagnetic shielding characteristics of the films with low concentration of quasi-1D $TaSe_3$ fillers in UHF band, where

The EMI shielding effectiveness of the composite with the low loading of quasi-1D TaSe$_3$ fillers (1.3 vol. %) and 1 mm thickness in UHF band were examined. The measurements were performed using the quasi-optical free space method. The coefficients of reflection, absorption, effective absorption, and transmission presented in FIG. 10(a) demonstrate the superior performance of the flexible films with quasi-1D fillers in the UHF band. Note that only 0.0002% of the incident EM wave is transmitted through the 1-mm-thick film. FIG. 10(a) indicates clearly that absorption is the dominant mechanism of the EMI shielding. The absorption $SE_A$ increases from 55 dB to 76 dB as the frequency varies from 220 GHz to 320 GHz. The EMI shielding by reflection contributes only approximately 1.5 dB to the total shielding, and it slightly decreases from 1.7 dB to 1.4 dB as the frequency increases. For comparison, the inset shows pristine epoxy's characteristics in the same frequency range. As shown, epoxy by itself is a poor shielding material and provides only the mean value of $SE_T \sim 1.5$ dB in the UHF range. The EMI shielding performance of quasi-1D fillers in insulating epoxy films is exceptional as compared to other fillers.

In accordance with one embodiment, quasi-1D van der Waals materials can be used as fillers in flexible polymer films providing excellent EMI shielding capability in the X-band and UHF-band. Polymer composites films (77 μm thickness) with only 2.8 vol. % of quasi-1D TaSe$_3$ exfoliated atomic thread fillers delivered 15 dB of total EMI shielding in the practically important X-band GHz frequency range. The EMI shielding efficiency of the developed materials expressed via the total shielding efficiency normalized by the mass density, thickness and filler loading fraction, $Z_B \sim 220$ dB/cm$^2$g, exceeds that of other polymers with various metallic, carbon nanotube or graphene fillers. The EMI shielding performance of the films with the quasi-1D fillers in UHF-band of sub-THz frequencies was particularly impressive. Total shielding efficiency $SE_T$ changed from 60 dB to above 70 dB as the frequency varied from 240 GHz to 320 GHz. This performance was achieved in composite films with only 1.3 vol. % loading of exfoliated quasi-1D fillers of TaSe$_3$ and the film thickness of 1 mm. Interestingly, the efficient EMI shielding was achieved in polymer films, which retained their DC electrically insulating properties, essential for many applications. The developed polymer films with quasi-1D fillers can be used, for example, for 5G-and-beyond communication technologies, which can require electromagnetic shielding films, are relatively flexible, light-weight, corrosion resistive, electrically insulating and relatively inexpensive.

Preparation of TaSe$_3$ 1.7315 g (9.57 mmol) of tantalum (STREM 99.98% purity) and 2.2718 g (28.8 mmol) of selenium (STREM 99.99% purity) were ground together gently with an agate mortar/pestle. This mixture was added to a 17.78×1 cm fused quartz ampule along with 62.3 mg iodine, (J. T. Baker, 99.9% purity). The ampule was evacuated and backfilled with Ar three times while submerged in an acetonitrile/dry ice bath, then flame sealed under vacuum. The ampule was placed in a Carbolite EZS 12/450B three-zone horizontal tube furnace and heated to 750-650° C. (source zone-growth zone) for 336 h. After the ampule had cooled to room temperature and was opened, the isolated shiny black crystals were left to sit in a fume hood for 1-2 h to allow excess iodine to sublime.

Polymer Composite Preparation

The bulk TaSe$_3$ crystals were filled into acetone with starting concentration of 0.5 mg/ml in 10 ml cylindrical vials and sonicated in a low power sonic bath (Branson 5510) for several hours. The vials were inspected visually every 2 hours to verify the quality of the dispersion. The resultant dispersion was centrifuged (Eppendorf Centrifuge 5810) at 7000 rpm for 5 to 10 minutes. The supernatant of the dispersion was collected and poured in a Peltier dish to dry for characterization purposes. The precipitant part of the dispersion as well as some part of the material which were sticked to the side walls of the vial after centrifugation were collected and left in the ambient air so the remaining part of the solvent evaporates. The result is dark brown exfoliated TaSe$_3$ threads with different aspect ratios. The variation in aspect ratio of the TaSe$_3$ fillers is beneficial in EMI shielding applications and has been discussed in the text. The obtained fillers were mixed in precalculated proportions with three different off-the-shelf base polymeric matrices of UVP, SA, and epoxy. The UVP was mixed with low volume fraction of TaSe$_3$ at 500 rpm for 10 minutes using a high-shear speed mixer (Flacktek Inc.). The prepared mixture was sandwiched between two pieces of nylons and pressed gently until a thin film is formed in between. The sandwich was left under the UV light for 2 minutes to cure. After that, the nylons were separated rather easily and a flexible film of UVP-TaSe$_3$ remained. In case of SA-based flexible films, the SA powder was added to the DI water, sealed and stirred for 2 hours on top of a hot plate with temperature set to 50° C. Then, the TaSe$_3$ filler was added to the solution at low concentrations. The mixture was stirred and sonicated for 30 minutes and drop casted on a Peltier dish. The dish was placed on a hot plate at 50° C. for almost 1 hour. The resultant was a dark brown flexible film. The epoxy composites were made by mixing the epoxy resin (bisphenol-A-(epichlorhydrin), molecular weight≤700, Allied High-Tech Products, Inc.) and hardener (triethylenetetramine, Allied High Tech Products, Inc.) with the mass ratio of 100 to 12, respectively. The TaSe$_3$ filler was added afterwards and mixed with the high-shear speed mixer at 500 rpm for 10 minutes. The compound was vacuumed for 10 minutes to remove the possible trapped air bubbles. The compound was mixed one more time at 300 rpm for 10 minutes, vacuumed, and then poured into especial molds to cure.

Mass Density Measurements

Using an electronic scale (Mettler Toledo), the weight of the samples was measured in air ($w_a$) and in DI water ($w_w$). In case of SA flexible films, the weights of the films were measured in air and ethanol ($w_e$) since SA is soluble in DI water. The mass density of the samples were calculated according to Archimedes principle $\rho_c=(w_a/(w_a-w_{w,e}))\times(\rho_{w,e}-\rho_a)+\rho_a$ where p is the density and subscripts "a", "w", and "e" corresponds to air, water, and ethanol, respectively. The volume fraction, $\phi$, of the TaSe$_3$ filler was calculated according to the rule of mixtures as $\phi=(\rho_c-\rho_p)/(\rho_f-\rho_p)$ where $\rho_p$ and $\rho_f$ are the density of the base polymer and TaSe$_3$ filler, respectively. The density values of each sample with its constituents are listed in Supplementary Information.

Electromagnetic Interference Shielding Measurements in X-Band

To determine EMI characteristics, the measured the scattering parameters, $S_{ij}$ were measured using the two-port PNA system. The indices i and j represents the ports, which are receiving and emitting the EM waves. Each port can simultaneously emit and detect the EM waves and thus, the results of the measurements include four parameters of $S_{11}$, $S_{12}$, $S_{21}$, and $S_{22}$. Owing to the symmetry of the samples, one can expect that $|S_{11}|=|S_{22}|$ and $|S_{12}|=|S_{21}|$. The scattering parameters are related to the coefficients of reflection, $R=|S_{11}|^2$, and transmission, $T=|S_{21}|^2$. The measurements were performed in the X-Band frequency range (8.2-12.4 GHz) with the frequency resolution of 3 MHz. A Programmable Network Analyzer (PNA) Keysight N5221A was used. The PNA was calibrated for 2-port measurements of scattering parameters $S_{ij}$ at input power $P_{in}$=3 dBm. A WR-90 commercial grade straight waveguide with two adapters at both ends with SMA coaxial ports was used as a sample holder. Special cables were used for high temperature RF measurements. The samples were a bit larger than the rectangular cross section (22.8×10.1 mm$^2$) of the central hollow part of the waveguide in order to prevent the leakage of EM waves from the sender to receiver antenna. The scattering parameters, $S_{ij}$, were directly measured and used to extract the reflection and absorption shielding efficiency of the composites.

Electromagnetic Interference Shielding Measurements in UHF-Band

The EMI shielding efficiency of the composite films in UHF-band was determined from the scattering parameters measured using the quasi-optic free space method. The measurement setup consisted of a vector network analyzer with a pair of frequency extenders—two high gain horn antennas and two double convex lenses. The measurements were performed in the range of frequencies from 220 GHz to 320 GHz. In order to obtain the reflection, R, and transmission, T, coefficients three measurements were performed. The first measurement was conducted with the sample, the second one was without the sample, and the third measurement was with a reference plane metal reflector. Two last measurements were used as the references to calculate the transmission and reflection coefficients, respectively. The reference measurements allow one to compensate for the transmission losses in the measurement path. The transmission and reflection coefficients are calculated according to the standard equations $$T = \frac{|S_{21s}|^2}{|S_{21e}|^2}, \tag{M1}$$

$$R = \frac{|S_{11s}|^2}{|S_{11m}|^2}, \tag{M2}$$

Here $S_{11s}$ and $S_{21s}$ are the results for the measurements with the sample, $S_{21e}$ is the result for the measurement with an empty optical path, $S_{11m}$ is the result for the measurement with a metal plate. In the case of multiple reflections in the quasi-optical path, the measurement data can be affected. To account for this possibility, an additional data processing step was applied. It consisted of the time domain gating. The latter was possible owing to the broad frequency range and a large number of the measurement points (up to 32000). The measured complex scattering parameters were transformed to the time domain. After that an appropriate time domain window was applied. Finally, the time gated data were transformed back to the frequency domain. This approach helps improve the accuracy and reliability of the obtained data for the transmission and reflection coefficients. The obtained R and T coefficients were used for calculation of the absorption coefficient, A, and the effective absorption coefficient, $A_{eff}$, which are given as $$A = 1 - R - T, \tag{M3}$$

$$A_{eff} = \frac{A}{1-R} = \frac{1-R-T}{1-R} = \frac{A}{A+T}. \tag{M4}$$

Both parameters define the EM absorption characteristics of the shielding material. One should note that $A_{eff}$ describes the actual absorption properties of the material since part of the EM energy is reflected from the surface of the material.

Electromagnetic-Polarization Selective Composites with Quasi-1D Van Der Waals Metallic Fillers In accordance with another embodiment, the preparation of flexible polymer composite films with aligned metallic fillers comprised of atomic chain bundles of the quasi-one-dimensional (1D) van der Waals material tantalum triselenide, TaSe$_3$ is disclosed. The material functionality, embedded at the nanoscale level, can beachieved by mimicking the design of an electromagnetic aperture grid antenna. The processed composites employ chemically exfoliated TaSe$_3$ nanowires as the grid building blocks incorporated within the thin film. Filler alignment is achieved using the "blade coating" method. Measurements conducted in the X-band frequency range demonstrate that the electromagnetic transmission through such films can be varied significantly by changing the relative orientations of the quasi-1D fillers and the polarization of the electromagnetic wave, and wherein such polarization-sensitive polymer films with quasi-1D fillers can be applicable to advanced electromagnetic interference shielding in communication systems.

Commonly, one selects functional materials with known characteristics to build a device or a system. In more elaborate approaches, one can engineer and synthesize materials with the required properties for specific applications. The inspiration for material selection, composition, and assembly can come from diverse sources. In one well-known approach, biomimetics, the models and elements of nature are applied to the design of synthetic systems. In an analogous approach, well-developed design solutions for macroscopic objects are translated into micro-, nano-, or atomic-scale structures. In accordance with one embodiment, a polymer composite is disclosed with polarization-sensitive electromagnetic interference (EMI) shielding characteristics by emulating the macroscopic structure and, to some degree, the functionality of an electromagnetic (EM) grid aperture antenna at the nanoscale level. A polarization-selective grid antenna is a set of parallel metal grid lines that allow transmission or reflection of radio-frequency (RF) radiation depending on the polarization of the radiation. This design allows a single structure to act as a mirror for RF radiation or become transparent to such radiation. When the polarization of the electric field is parallel to the grid lines, the electric field induces a current in the grid lines, which reflects the EM wave. In the alternate case, with the polarization of the electric field perpendicular to the grid lines, no current is induced, and the EM radiation passes through the grid. Polarization selection grids are often manufactured with metal wire tracks, usually copper, on a dielectric substrate. The spacings between grid lines must be small relative to the wavelength of the linear polarized EM waves. Here, a similar antenna design can be used, albeit at the nanometer scale, to create a "grid-antenna film."

The grid antenna design in nano-composites is mimicked by employing chemically-exfoliated bundles of a quasi-one-dimensional (1D) van der Waals material, tantalum triselenide (TaSe$_3$). The potential of TaSe$_3$ for extremely high current density and effective EMI shielding, even with random filler distribution and low filler loading fractions. The quasi-1D van der Waals materials include the transition metal trichalcogenides (TMTs) with formula MX$_3$ (M=transition metal, X=S, Se, Te), such as TiS$_3$, NbS$_3$, TaSe$_3$, and ZrTe$_3$, as well as other materials containing 1D structural motifs. As opposed to TMDs, TMTs exfoliate into nanowire-type structures or nanoribbon-type structures, which stem from their unique chain-based crystal structures, illustrated for TaSe$_3$ in FIG. 11(a). In principle, these low dimensional materials can be exfoliated into individual atomic chains or few-chain atomic threads. There are many quasi-1D van der Waals materials that retain their metallic or semiconductor properties when exfoliated to atomic chains. The exfoliated bundles of TaSe$_3$ atomic threads with cross-sections in the range of 10 nm×10 nm to 100 nm×100 nm revealed exceptionally high current densities of up to approximately 30 MA/cm$^2$, an order of magnitude higher than that of copper. Additionally, the liquid phase exfoliated (LPE) TaSe$_3$ bundles can be millimeters in length, providing substantial aspect ratios. The current-carrying capability of the metallic TaSe$_3$, in addition to their high-aspect-ratios, such that they can be used as "metallic grids" even when scaled down to 100-nm features or below.

Figures 11A, 11B, 11C, 11D:
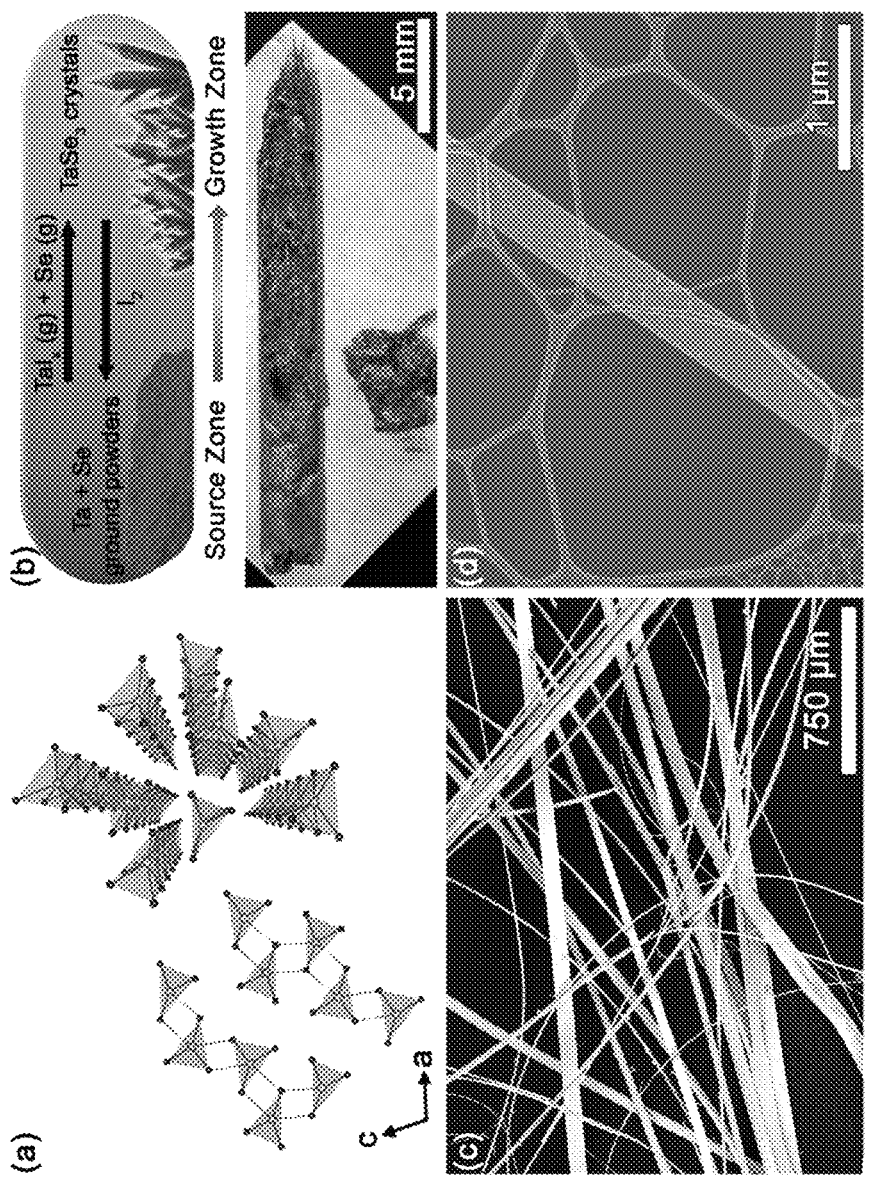
FIGS. 11(a)-11(d) illustrate crystal structure of quasi-1D $TaSe_3$, where
Figures 12A, 12B, 12C, 12D:
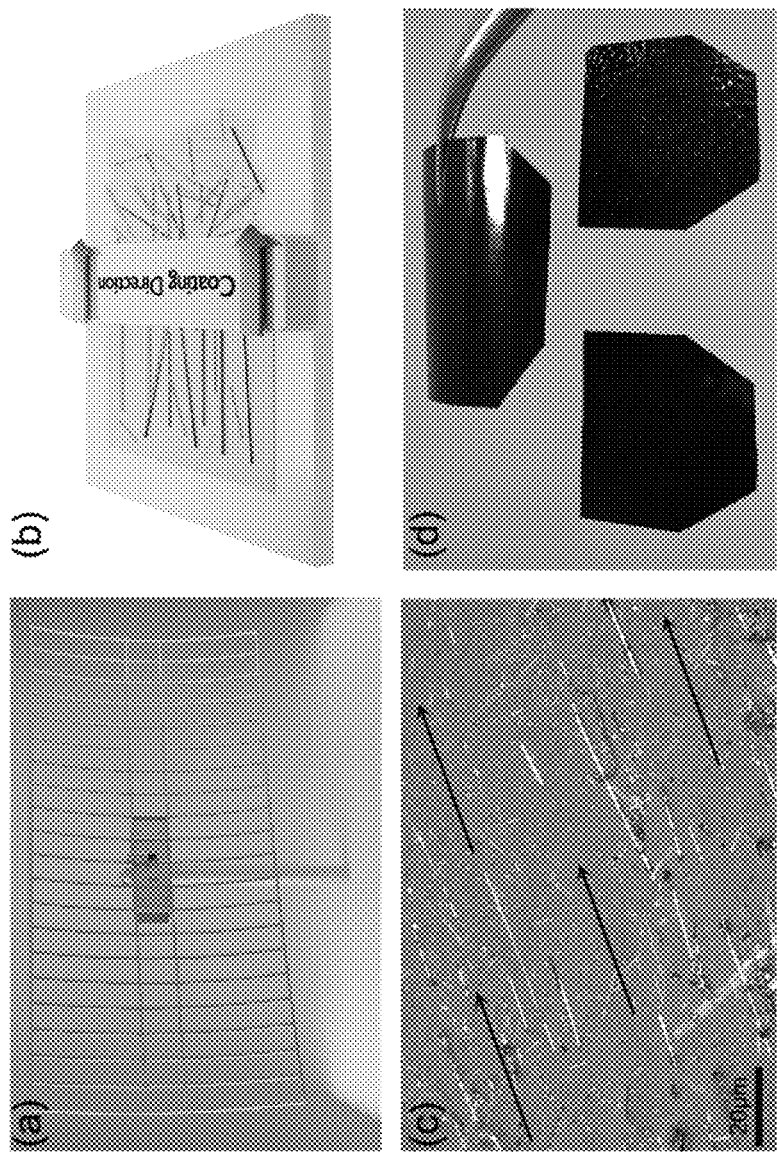
FIGS. 12(a)-12(d) illustrate system-level concept and material-level implementation, where FIG. 12(a) view of the aperture grid antenna illustrating the required function—polarization selectivity, FIG. 12(b) schematic of the "blade coating" filler alignment process in the polymer films, in which the bundles of quasi-1D atomic threads function as metal wires in a grid antenna, FIG. 12(c) optical microscopy image of the UV-cured polymer film with 1.8 vol % of $TaSe_3$ quasi-1D fillers. Note the aligned high-aspect-ratio $TaSe_3$ fillers along the coating direction, and FIG. 12(d) optical image of the resulting flexible polymer films with incorporated quasi-1D fillers, which mimic the action of a grid antenna.

In accordance with one embodiment, TaSe$_3$ crystals were prepared by chemical vapor transport (CVT). In contrast to typical CVT reactions, where the goal is the growth of a relatively small number of larger crystals, reaction conditions were varied to yield 0.7-1.5 g batches of TaSe$_3$ crystals for composite preparation. Transport can be achieved using iodine as the transport agent and/or by using a 625° C.-600° C. temperature gradient. As can be seen in FIG. 11(b), the scale of these reactions led to the growth of TaSe$_3$ crystals almost entirely filling the ampule volume. The resulting mat of crystals could be removed easily, providing 18%-38% yields of mm- to cm-long needlelike or fibrous crystals (FIG. 11(b)), and leaving behind a quantity of microcrystalline solid that was not used for subsequent exfoliation. The long crystals have the smooth faces and straight edges that characterize high-quality TaSe$_3$ samples (FIGS. 11(c) and 11(d)). Powder x-ray diffraction and energy dispersive spectroscopy provided analytical results consistent with the standard structure of TaSe$_3$, albeit with some variation in Se content.

These CVT grown TaSe$_3$ crystals were subjected to the liquid phase exfoliated (LPE) process. FIGS. 12(a)-12(d) summarizes the approach of mimicking the grid antenna design using material synthesis and presents optical images of the partially aligned fillers in the polymer composites and the resulting films. A "blade coating" method can be used to prepare flexible thin films with a thickness of 100 μm±10 μm with a special type of UV-cured polymer and exfoliated TaSe$_3$ as fillers. In this method, a small amount of polymer-filler solution is drop cast on a rigid substrate with a smooth surface. A blade with an adjustable distance from the top surface of the substrate is gradually run over the mixture and spread the compound over the substrate (FIG. 12(b)). Using this technique, the quasi-1D fillers are aligned, to some extent, in the direction of the coating owing to the applied viscoelastic shear stress as a result of blade movement (FIG. 12(c)). The samples are referred to as A, B, C, and D throughout this manuscript with filler concentrations of 2.2 vol %, 1.03 vol %, 1.87 vol %, and 1.61 vol %, respectively.

EM testing of the prepared films was conducted in the X-band frequency range (f=8.2 GHz-12.4 GHz), which is pertinent, for example, to communication technologies. To determine the polarization selectivity, the measurement protocols used in EMI shielding testing were followed. The scattering parameters, $S_{ij}$, were measured with the two-port programmable network analyzer (PNA; Keysight N5221A). The scattering parameters are related to the coefficients of reflection, $R=|S_{11}|^2$, and transmission, $T=|S_{21}|^2$. The measurements can be carried out in a WR-90 commercial grade straight waveguide with two adapters at both ends with SMA coaxial ports. The samples were made a bit larger than the rectangular cross-section (a=22.8 mm, b=10.1 mm) of the central hollow part of the waveguide to prevent the leakage of the EM waves from the sender to the receiver antenna. The cut-off frequency for different fundamental transverse electric (TE) modes in rectangular shaped waveguides $$(f_c)_{mn} = \frac{1}{2\pi\sqrt{\mu\varepsilon}}\sqrt{(m\pi/a)^2 + (n\pi/b)^2}$$

[Hz] where m and n are positive integer numbers. Therefore, the dominant EM mode in WR-90 waveguide is $TE_{10}$ mode with electrical field (E) oscillating in the vertical direction perpendicular to the larger side of the inlet aperture (see FIGS. 13(a) and 13(b)).

Figures 13A, 13B:
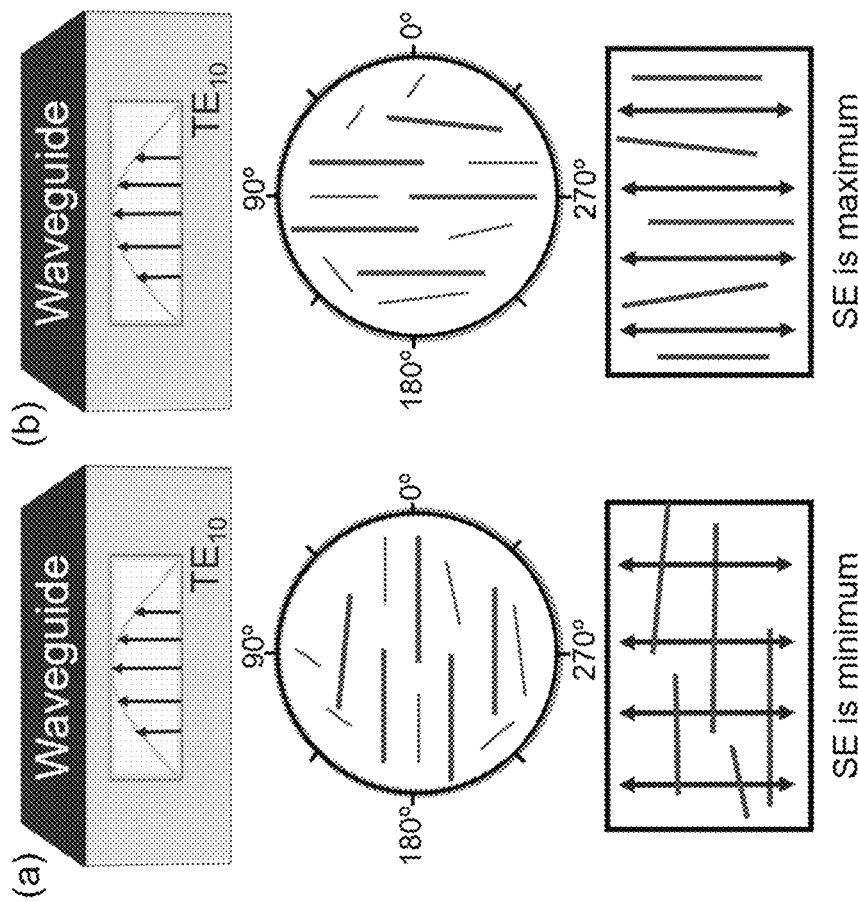
Figures 14A, 14B, 14C, 14D:
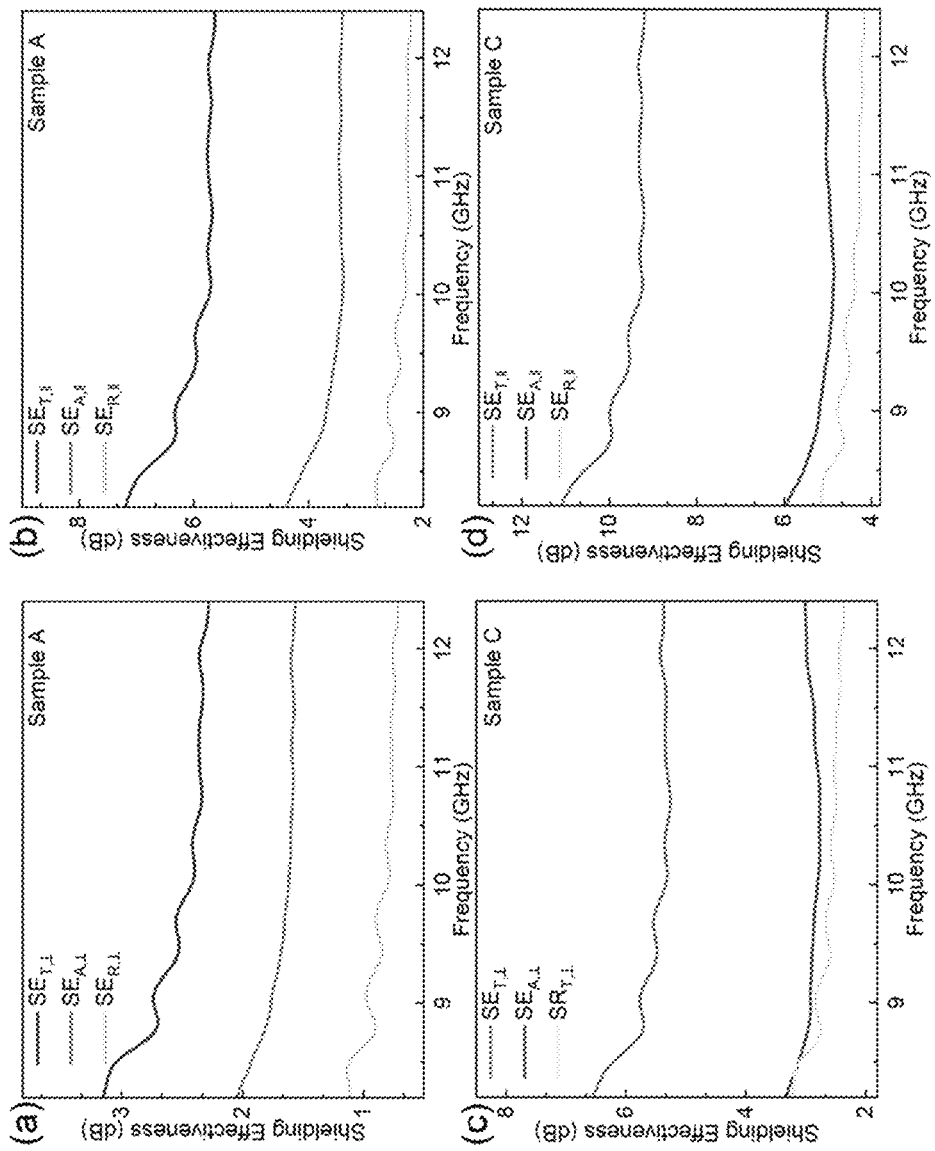
FIGS. 14(a)-14(d) illustrate electromagnetic data. Reflection ($SE_R$), absorption ($SE_A$), and total ($SE_T$) EMI shielding effectiveness of (FIGS. 14(a) and 14(b)) sample A and (FIGS. 14(c)-14(d)) sample C for two cases of the EM wave polarization transverse to (⊥) and parallel with (H) the quasi-1D fillers. Note that the EMI shielding is significantly higher when the polarization is parallel to the filler alignment.
Figures 15A, 15B, 15C, 15D:
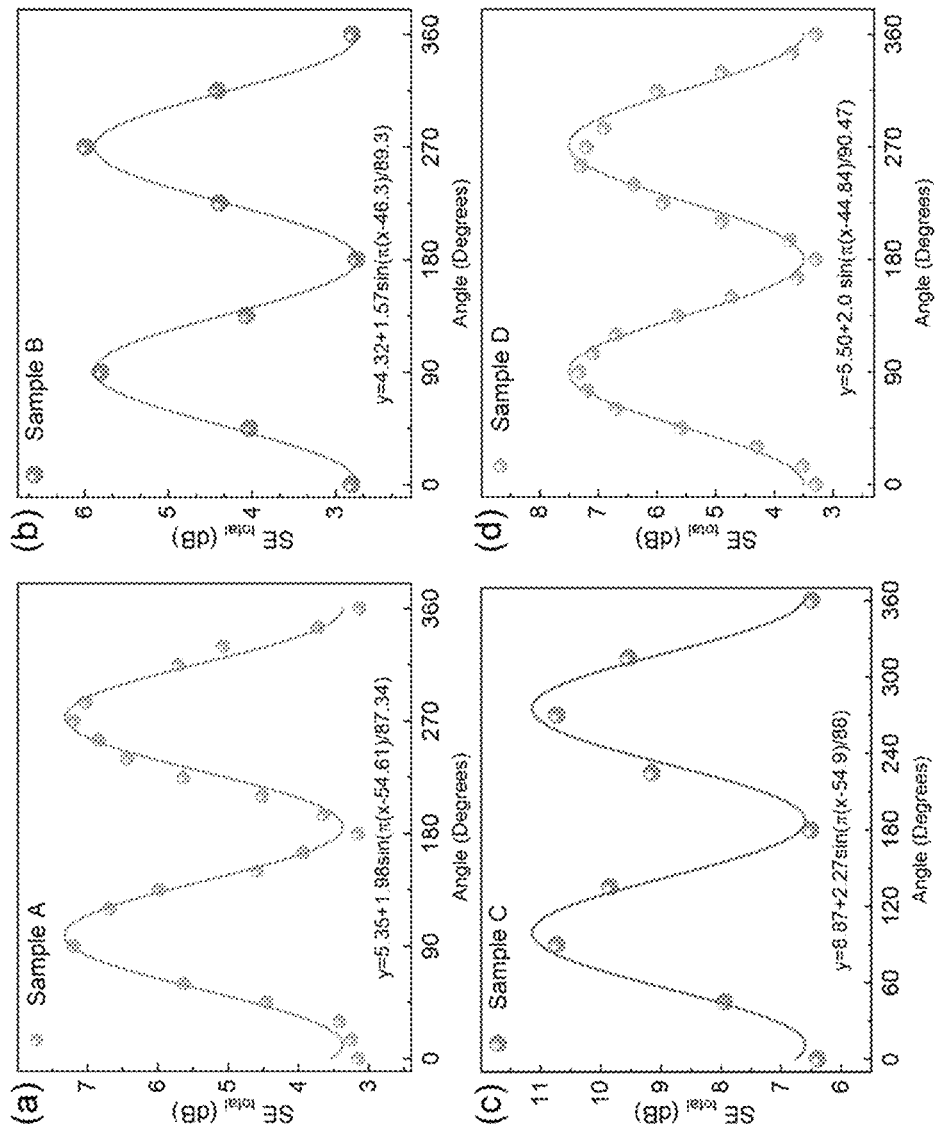
FIGS. 15(a)-15(d) illustrates electromagnetic-polarization selective composites. Total shielding effectiveness of all samples as a function of the composite orientation angle α, measured at 8.2 GHz frequency. At α=0°, the polarization of the EM wave is perpendicular to the filler alignment. The results are fitted with sine functions. Note the periodicity of the $SE_T$ with a period of 180 degrees.

To investigate the effect of the filler alignment on the EM characteristics of the composites, measurements were carried out at different sample orientation angles (α) by rotating the sample about the guide axis. Note that α is the angle between the aligned filler chains in the composite with respect to the larger side of the guide's aperture. Therefore, at α=0°, the fillers are parallel to the larger side and E is perpendicular to them. The front-view schematic of the WR-90 waveguide, the electric field configuration of $TE_{10}$ mode, and its mutual orientation with respect to the quasi-1D fillers of the composites are shown in FIGS. 13(a) and 13(b). FIGS. 14(a)-14(d) illustrate the reflection ($SE_R$), absorption ($SE_A$), and total ($SE_T$) shielding effectiveness of samples A and C with 2.2 vol % and 1.87 vol % filler concentration as a function of EM frequency when the polarization of the incident EM wave is either parallel with (∥) or transverse to (⊥) the quasi-1D fillers. Note that the shielding effectiveness of the films is significantly enhanced when E is parallel with the filler alignment comparing to the case it is perpendicular to the filler chains.

The angular dependence of $SE_T$ of all four samples were measured at the constant frequency of f=8.2 GHz to elucidate the effect of the filler alignment on EM shielding properties of the composites. The results of these measurements are presented in FIGS. 15(a)-15(d). Note that at α=0°, E is perpendicular to the filler atomic chains. One can notice the sinusoidal characteristic of the $SE_T$ (solid lines) with a period of 180 degrees as a function of α. When the fillers are aligned in one direction, the composite film becomes anisotropic, given that the embedding matrix is isotropic. The results are consistent for all examined samples with different loading of the aligned quasi-1D fillers. The shielding effectiveness of the samples prepared by the "compressional molding," with randomly oriented fillers, does not exhibit any angular dependency characteristic. The latter provides additional evidence of the filler alignment when the "blade coating" method is applied during the synthesis of the sample.

The periodic EM shielding characteristics observed in the composites originate from two different effects: (i) the prolate ellipsoidic needle-like geometry of the fillers, assuming semi axes of $a_x > a_y = a_z$; and (ii) the anisotropic complex permittivity properties of the quasi-1D $TaSe_3$ fillers. Because the filler inclusion is low in all the samples, the Maxwell-Garnett (M-G) effective medium theory can be used to explain the observed characteristics. For composites with aligned dielectric fillers, the M-G effective complex permittivity of the composite along the x direction, $\varepsilon_{c,x}$, can be described as:

$$\varepsilon_{c,x} = \varepsilon_p + \phi_f \varepsilon_p \frac{\varepsilon_f - \varepsilon_p}{\varepsilon_f + (1-\phi_f)N_x(\varepsilon_f - \varepsilon_p)} \quad (1)$$

In this equation, $\varepsilon_p$ and $\varepsilon_f$ are the permittivity of the polymer and filler and $\phi_f$ is the filler volume fraction. For ellipsoidal fillers, the depolarization factor, $$N_x = \left(\frac{1-e^2}{2e^3}\right)\left(\ln\frac{1+e}{1-e} - 2e\right)$$

in which the eccentricity is $e=\sqrt{1-a_y^2/a_x^2}$. Considering the large aspect ratio of the exfoliated fillers ($a_x \gg a_y$), it can be rather easily inferred that the effective permittivity of the composites would be largely different along different directions, i.e. parallel with and perpendicular to the aligned atomic chains. Note that to obtain the effective permittivity along other directions, y and z, the depolarization factor should be replaced by $N_y$ and $N_z$ and calculated accordingly.

The special geometrical shape of the aligned fillers is not the only parameter causing anisotropic behavior of composites with quasi-1D fillers. Owing to the monoclinic crystal structure of $TaSe_3$, the EM properties of the fillers can be highly directional. The polarized reflectance data of $TaSe_3$ exhibits metallic characteristic in the infrared region. Since there is no data on the dielectric properties of $TaSe_3$ in the microwave region, the complex dielectric parameter of $TaSe_3$ can be described as a function of EM frequency, ω, by the Lorentz-Drude model, $$\varepsilon(\omega) = \varepsilon_\infty - \frac{\omega_p^2}{\omega^2 - i\omega\Gamma_0} + \Sigma_{n=1}^m \frac{\omega_{p,n}^2}{\omega_{0,n}^2 - \omega^2 - i\omega\Gamma_n}.$$

In this model, $\varepsilon_\infty$ is the permittivity of the material when the frequency goes to infinity, m is the number of the oscillators with the frequency of $\omega_{0,n}$ and the lifetime of $1/\Gamma_n$, respectively. The plasma frequency, $\omega_p = \sqrt{Nq^2/m^*\varepsilon_0}$, depends on the electron density, N, electron absolute charge, q, and the effective mass of electrons, m*. The second and third terms are associated with the interaction of EM waves with the intra-band, or free-electrons, and inter-band, or bound-electrons, respectively. The $\hbar\omega_p$ in $TaSe_3$ along the crystallographic "a" (perpendicular to the chains) and "b" (along the chains) axes are 0.42 eV and 0.68 eV.[32]. Therefore, one would expect an anisotropic frequency-dependent reflectance (R) and conductance (σ) along with and perpendicular to the atomic chains in the microwave region, with both parameters being larger in the direction along the atomic chains. Such strong, anisotropic reflectance properties have been reported for $TaSe_3$ in the EM energy range between 0.05 eV to 5 eV, previously.

Figures 16A, 16B:
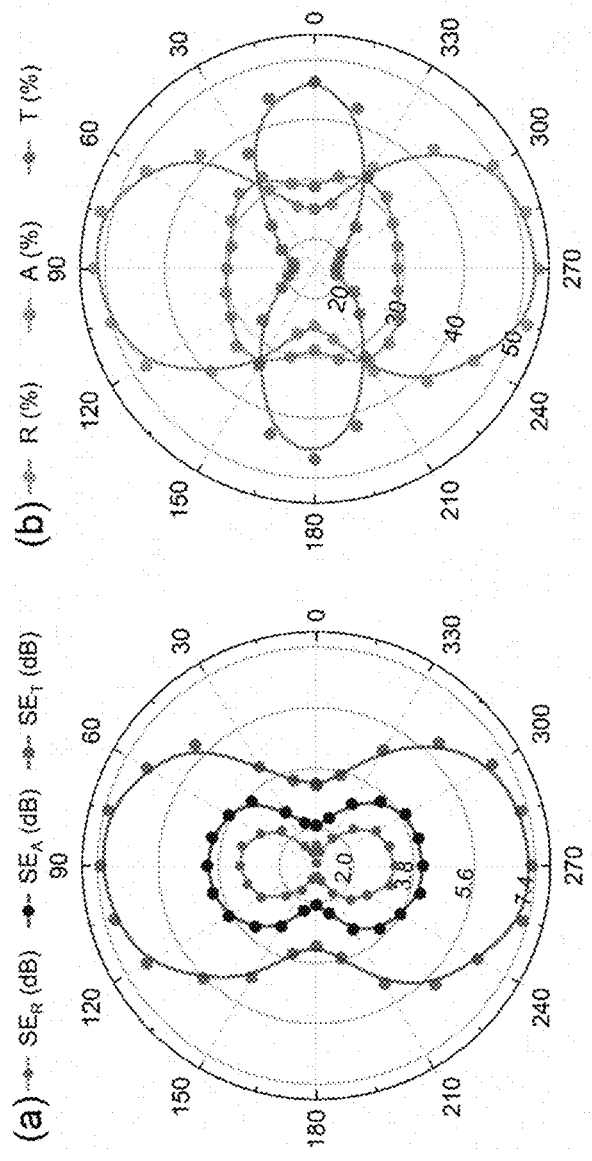
FIGS. 16(a)-16(b) illustrate contribution of different mechanisms to interaction with EM waves, where angular dependency of FIG. 16(a) the reflection, absorption, and total shielding effectiveness, and FIG. 16(b) reflection absorption, and transmission coefficients of sample D with 1.61 vol % aligned quasi-1D $TaSe_3$ fillers. Note the extremes at 0 and 90 degrees and the symmetry of the curves in both panels confirming the alignment of fillers inside the polymer matrix.
Figures 17A, 17B, 17C, 17D:
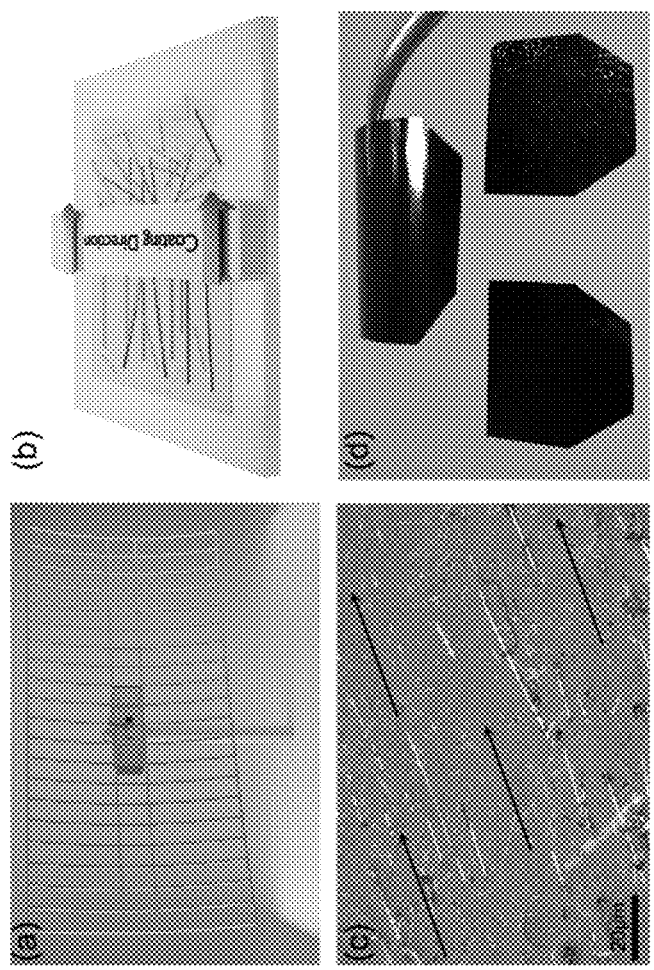
FIGS. 17(a)-17(d) illustrates a schematic of one or more embodiments, where FIG. 17(a) metal aperture grid antenna used as the concept for one embodiment, FIG. 17(b) illustration of the preparation technique for synthesis of composites with aligned quasi-1D van der Waals fillers, FIG. 17(c) microscopy image showing the alignment of the fillers, and FIG. 17(d) view of the synthesized samples.

FIG. 16(a)-16(b) exhibits the angular dependent reflection, absorption, and transmission shielding effectiveness and coefficients of sample D, respectively. The four-fold symmetry of all plots shown in both panels confirms the alignment of quasi-1D fillers. More importantly, as illustrated in FIG. 16(b), reflection is the dominant mechanism of shielding of the EM waves in the microwave region. The reflection coefficient increases more than two times comparing the two extreme cases of α=0° and α=90° whereas the absorption almost does not vary. The four-fold symmetric transmission curve in FIG. 16(b) demonstrates the applicability of prepared flexible films as microwave attenuators or grid polarizers. For reference, the shielding effectiveness in the samples prepared by the "compressional molding" does not reveal any angular dependence. The observed EM property is similar to the linear dichroism, which has been reported in the visible light region for bulk and exfoliated MPX$_3$ crystals with strong optical anisotropy. Bulk TiS$_3$ exhibit a linear dichroism with transmittance ratio of $\zeta=T_\perp/T_\parallel=30$ at the wavelength of 633 nm.

The preparation and properties of flexible polymer composite films with aligned metallic fillers made of bundles of quasi-one-dimensional (1D) van der Waals metal are disclosed, characterized by high current density. The material functionality, embedded at the nanoscale level, was achieved by mimicking the design of an electromagnetic aperture grid antenna. The synthesized composites use the quasi-1D van der Waals nanowires as the grid building block incorporated within the thin-film structure. The measurements conducted in the X-band frequency range demonstrated that the electromagnetic transmission through such films could be varied by changing the mutual orientation of the quasi-1D fillers and polarization of the electromagnetic wave. The films with low loading of the quasi-1D fillers (<2 vol. %) and only partial alignment of the fillers can already produce ~5 dB variation in the transmitted signal. In addition, such polarization-sensitive polymer films with quasi-1D fillers can be used for advanced electromagnetic interference shielding, for example, in communication systems.

Composites with Aligned Fillers Made out of Chemically Exfoliated Quasi-1D Van Der Waals Materials In this method, a small amount of polymer-filler solution is drop cast on a rigid substrate with a smooth surface. A blade with an adjustable distance from the top surface of the substrate is gradually run over the mixture and spread the compound over the substrate (see FIGS. 17(a)-17(d)). Using this technique, the quasi-1D fillers are aligned, to some extent, in the direction of the coating owing to the applied viscoelastic shear stress as a result of blade movement. The alignment allows one to achieve additional functionality: electromagnetic polarization selective EMI shielding. For example, flexible composite thin films were developed with a thickness of 100 µm±10 µm with a special type of UV-cured polymer and exfoliated TaSe3 as fillers.

During the tests, the measurements conducted in the X-band frequency range demonstrate that the electromagnetic transmission through such films can be varied significantly by changing the relative orientations of the quasi-1D fillers and the polarization of the electromagnetic wave. The developed polarization-sensitive polymer films with quasi-1D fillers are applicable to advanced electromagnetic interference shielding, for example, in communication systems.

The detailed description above describes an electromagnetic interface (EMI) shielding material and method for producing an electromagnetic interface (EMI) shielding material. The invention is not limited, however, to the precise embodiments and variations described. Various changes, modifications and equivalents can be effected by one skilled in the art without departing from the spirit and scope of the invention as defined in the accompanying claims. It is expressly intended that all such changes, modifications and equivalents which fall within the scope of the claims are embraced by the claims.

What is claimed is:

1. A composite material with an electromagnetic interface (EMI) shielding material for frequencies of 1 MHz and greater and less than 1 THz, the composite material comprising:
   a polymer matrix and a van der Waals material embedded in the polymer matrix, the van der Waals material forming quasi-one-dimensional atomic threads, and the van der Waals material being a trichalcogenide compound;
   two-dimensional graphene embedded in the polymer matrix and mixed with the van der Waals material; and
   wherein the polymer matrix includes an epoxy resin and the two-dimensional graphene embedded in the polymer matrix and mixed with the van der Waals material, and wherein the van der Waals material has a loading fraction of 1.0 vol. % to 50 vol. % of the composite material.

2. The composite material of claim 1, wherein the two-dimensional graphene is few-layer graphene filler having a thickness of 0.35 nm to 20 nm.

3. The composite material of claim 1 wherein the two-dimensional graphene is a graphene filler having two or more different thicknesses of 0.35 nm to 20 nm, and lateral dimensions of 100 nm to 50 µm.

4. The composite material of claim 1, wherein the van der Waals material includes one or more of TaSe$_3$, ZrTe$_3$, and transition metal trichalcogenides materials with quasi-1D crystal structure.

5. The composite material of claim 4, wherein the TaSe$_3$ is monoclinic TaSe$_3$.

6. The composite material of claim 4, wherein the quasi-one-dimensional atomic threads have a length of 1 µm to 10 mm and a diameter of 1 nm to 10 nm in an exfoliated form.

7. The composite material of claim 4, wherein the quasi-one-dimensional atomic threads have a length of 100 µm to 500 µm and a diameter of 50 nm to 100 nm in an exfoliated state.

8. The composite material of claim 1, wherein the trichalcogenide compound is selected from one or more transition metal trichalcogenides and alloys of the transition metal trichalcogenides.

9. The composite material of claim 8, wherein the transition metal trichalcogenides having a chemical formula of MX$_3$, where M=V, Nb, Ta, or other transition metals, and X is S, Se, or Te.

10. The composite material of claim 1, wherein the polymer matrix includes an epoxy resin, a UV-cured polymer, or sodium alginate.

11. The composite material of claim 1, comprising:
    two or more layers of EMI shielding materials, the two or more layers of EMI shielding material including a first layer for EMI shielding and a second layer for heat removal.

12. The composite material of claim 1, wherein the loading fraction of van der Waals material is 2.5 vol. % to 19.5 vol. % of the composite material.

13. The composite material of claim 12, further comprising:
    a hardener added to the epoxy resin.

14. The composite material of claim 1, wherein
    the polymer matrix includes an epoxy resin, a polymer configured to be cured from ultraviolet irradiation or sodium alginate; and
    the van der Waals material embedded in the polymer matrix is TaSe$_3$.

15. The composite material of claim 14, wherein the TaSe$_3$ has a loading fraction of less than 3 vol. % of the composite material.

16. The composite material of claim 14, wherein the TaSe$_3$ has a loading fraction of 1.14 vol. % to 2.8 vol. % of the composite material.

17. An electronic device including the composite material of claim 1.

18. A method of producing a composite material with an electromagnetic interface (EMI) shielding material comprising:
  embedding a van der Waals material in a polymer matrix, the van der Waals material being quasi-one-dimensional atomic threads, and wherein the polymer matrix includes an epoxy resin, a polymer configured to be cured from ultraviolet irradiation or sodium alginate, and the van der Waals material embedded in the polymer matrix is $TaSe_3$, and wherein the $TaSe_3$ has a loading fraction of less than 3 vol. % of the composite material.

19. The method according to claim 18, further comprising:
  embedding two-dimensional graphene in the polymer matrix and mixed with the van der Waals material.

* * * * *